(12) United States Patent
Fan et al.

(10) Patent No.: US 9,543,419 B1
(45) Date of Patent: Jan. 10, 2017

(54) FINFET STRUCTURES AND METHODS OF FORMING THE SAME

(71) Applicant: Taiwan Semiconductor Manufacturing Company, Ltd., Hsin-Chu (TW)

(72) Inventors: Chun-Hsiang Fan, Hsin-Chu (TW); Yung-Ta Li, Kaohsiung (TW); Mao-Lin Huang, Hsin-Chu (TW); Chun-Hsiung Lin, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/858,971

(22) Filed: Sep. 18, 2015

(51) Int. Cl.
| | |
|---|---|
| *H01L 21/336* | (2006.01) |
| *H01L 29/66* | (2006.01) |
| *H01L 29/423* | (2006.01) |
| *H01L 29/06* | (2006.01) |
| *H01L 21/306* | (2006.01) |

(52) U.S. Cl.
CPC ... *H01L 29/66818* (2013.01); *H01L 21/30612* (2013.01); *H01L 29/0642* (2013.01); *H01L 29/42392* (2013.01)

(58) Field of Classification Search
CPC ............... H01L 21/823431; H01L 21/823821; H01L 27/0924; H01L 27/10826
See application file for complete search history.

(56) References Cited

U.S. PATENT DOCUMENTS

2010/0140708 A1* 6/2010 Hill .................. G02B 6/136
257/348

FOREIGN PATENT DOCUMENTS

TW     201203351 A     1/2012

* cited by examiner

*Primary Examiner* — Elias M Ullah
(74) *Attorney, Agent, or Firm* — Slater Matsil, LLP

(57) ABSTRACT

An embodiment is a method including forming an epitaxial portion over a substrate, the epitaxial portion including a III-V material. A damaged material layer being on at least one surface of the epitaxial portion. The method further including oxidizing at least outer surfaces of the damaged material layer to form an oxide layer, selectively removing the oxide layer, and repeating the oxidizing and the selectively removing steps while at least a portion of the damaged material layer remains on the epitaxial portion.

20 Claims, 33 Drawing Sheets

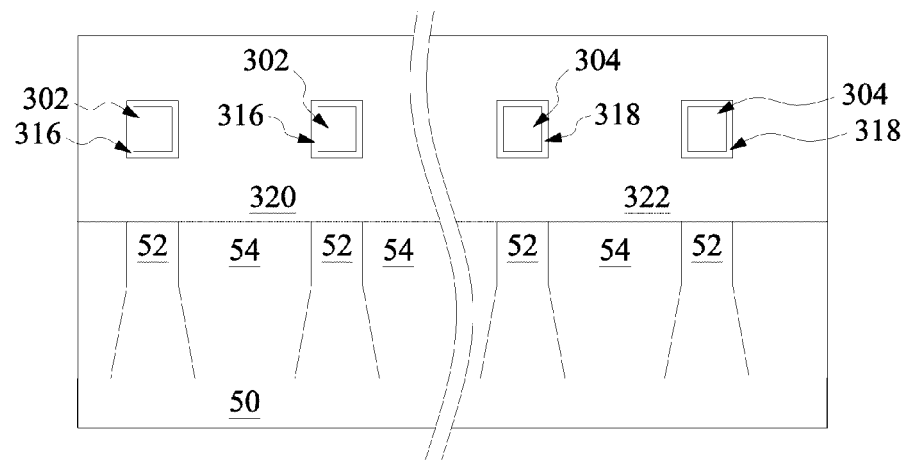
Fig. 33A
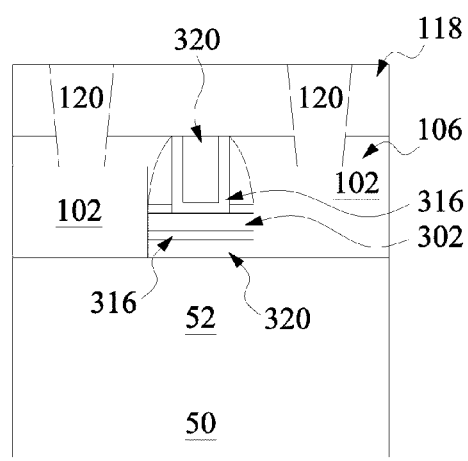 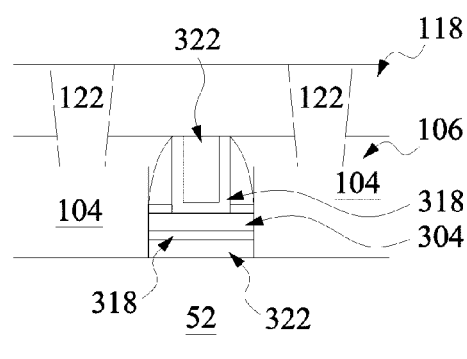
Fig. 33B  Fig. 33C

FINFET STRUCTURES AND METHODS OF FORMING THE SAME

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, Fin Field-Effect Transistors (FinFETs) or multiple gate transistors are being researched and implemented. However, with this new device structure and the continuous shrinking of even FinFETs, new challenges are being discovered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 25 through 32 and 33A-C are cross-sectional views of intermediate stages in the manufacturing of a Gate All-Around (GAA) device in accordance with some embodiments.

DETAILED DESCRIPTION

Figure 1:
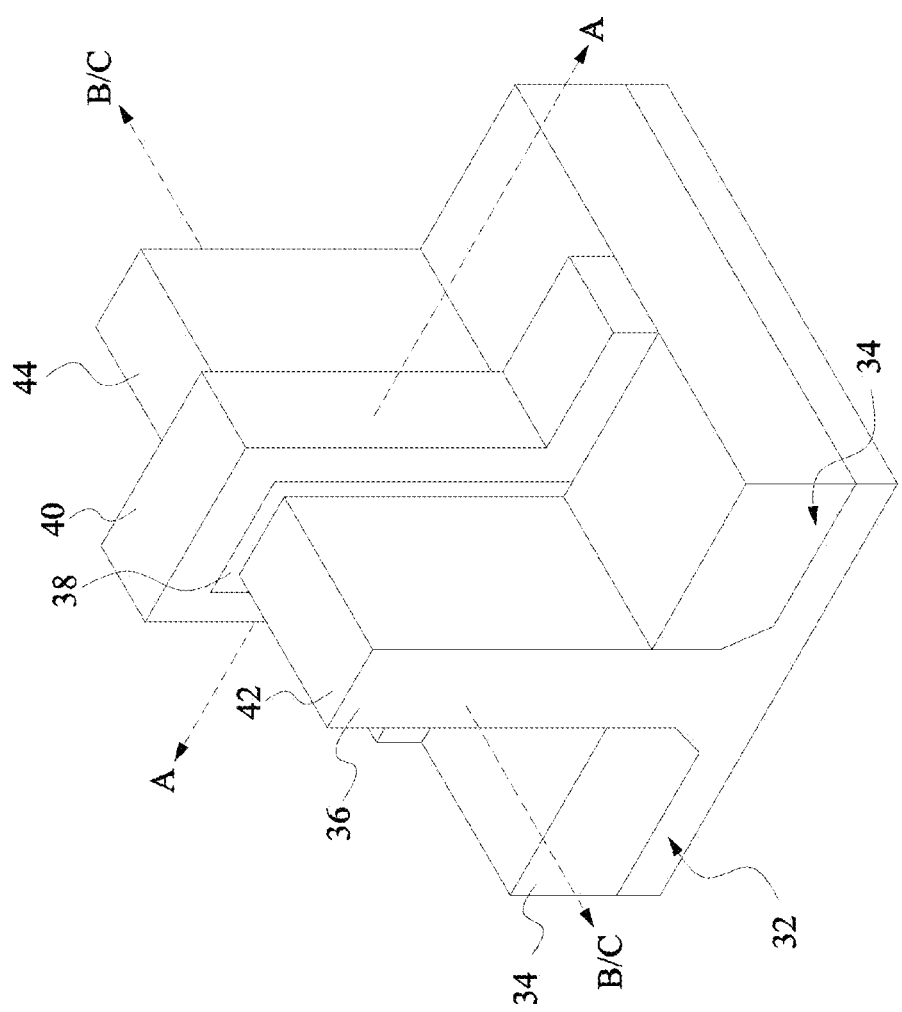
FIG. 1 is an example of a Fin Field-Effect Transistor (FinFET) in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Also, some embodiments contemplate aspects used in planar devices, such as planar FETs and other embodiments contemplate aspects used in gate all-around (GAA) devices, such as GAA FETs. In particular, FETs are described herein having channels formed of III-V materials. Intermediate stages of forming FinFETs and GAA FETs are illustrated. Some embodiments discussed herein are discussed in the context of FETs formed using a gate-last process. In other embodiments, a gate-first process may be used. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIG. 1 illustrates an example of a FinFET 30 in a three-dimensional view. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section A-A is across a channel, gate dielectric 38, and gate electrode 40 of the FinFET 30. Cross-section B/C-B/C is perpendicular to cross-section A-A and is along a longitudinal axis of the fin 36 and in a direction of, for example, a current flow between the source/drain regions 42 and 44. Subsequent figures refer to these reference cross-sections for clarity.

Figure 23A:
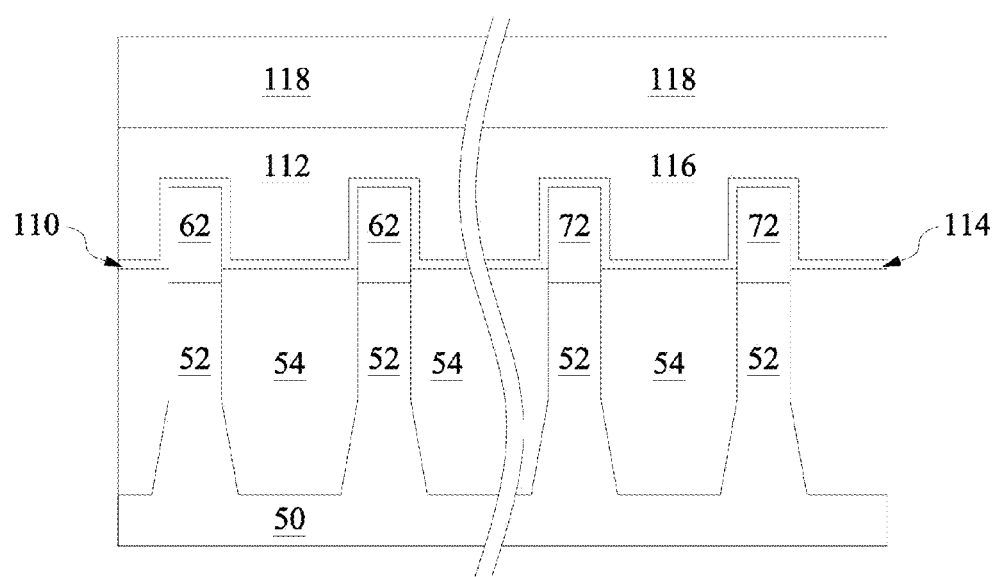
Figure 23B:
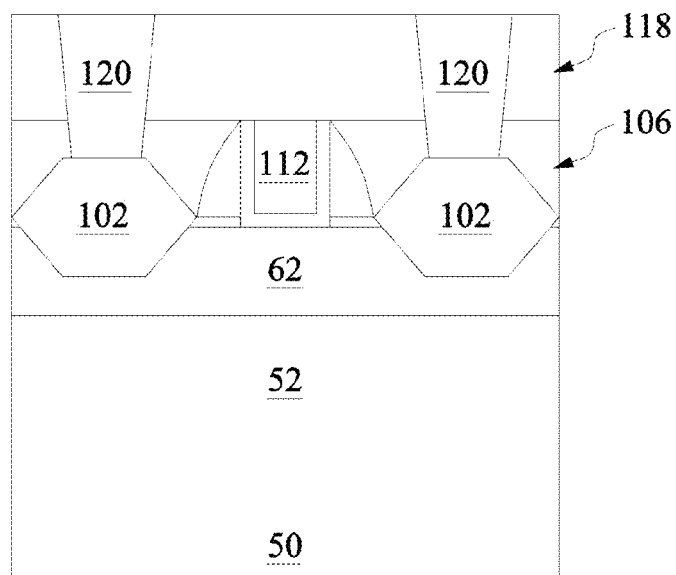
Figure 23C:
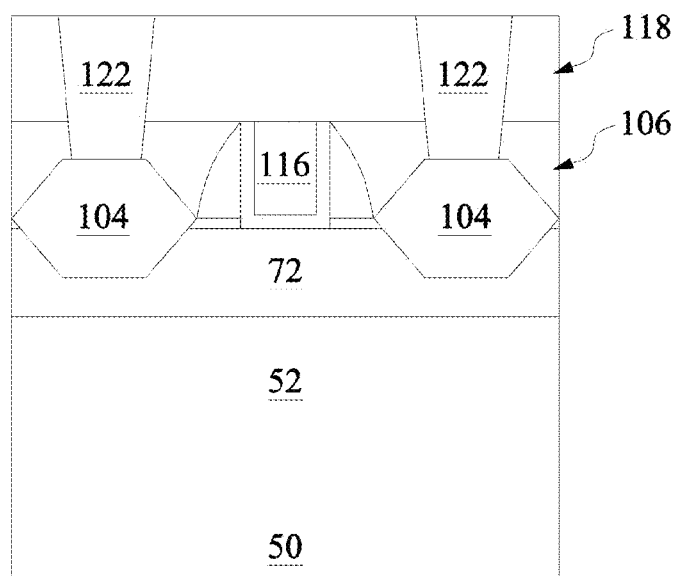
Figure 24A:
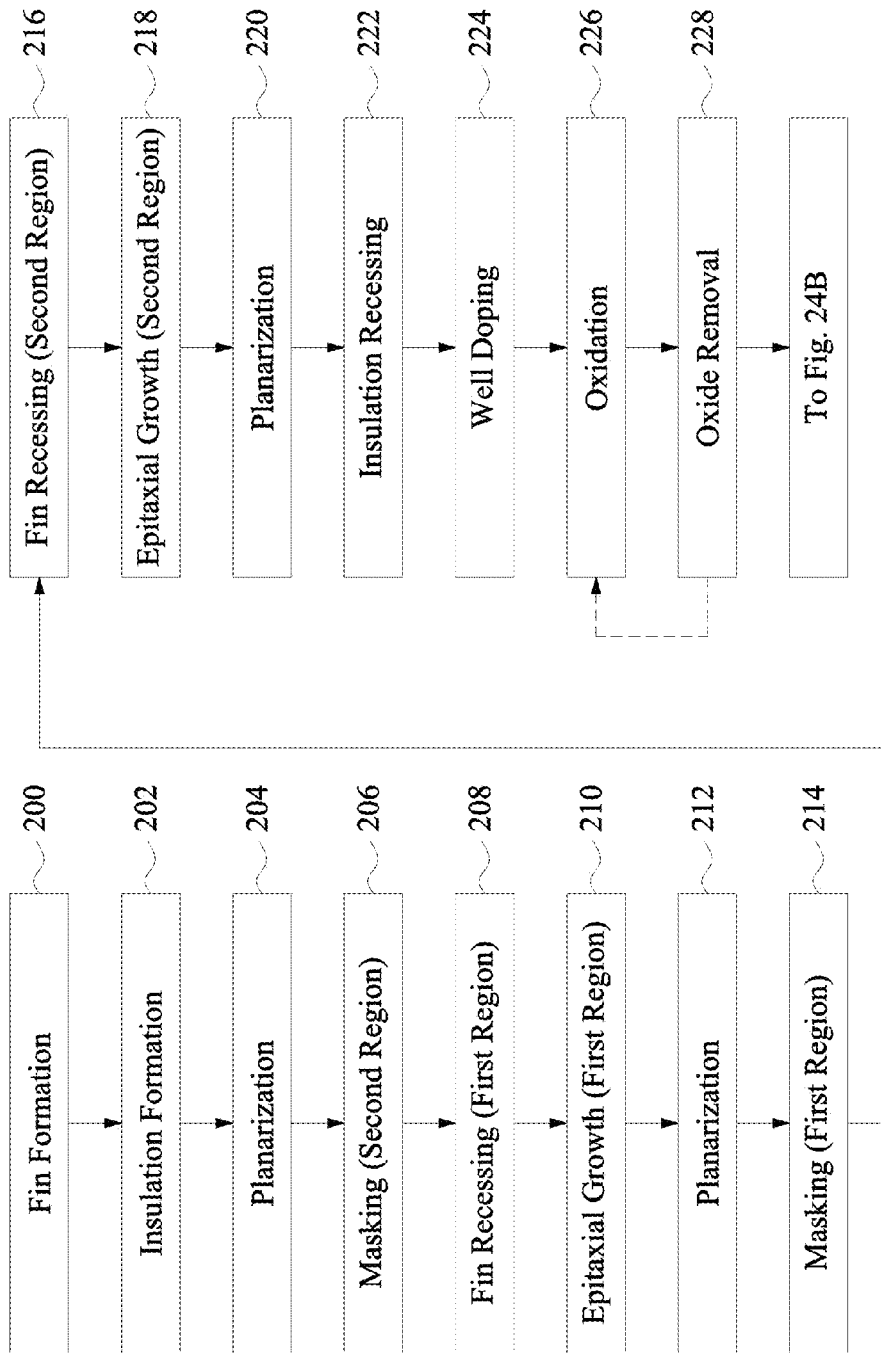
FIGS. 24A and 24B are a process flow of a process in accordance with some embodiments.
Figure 24B:
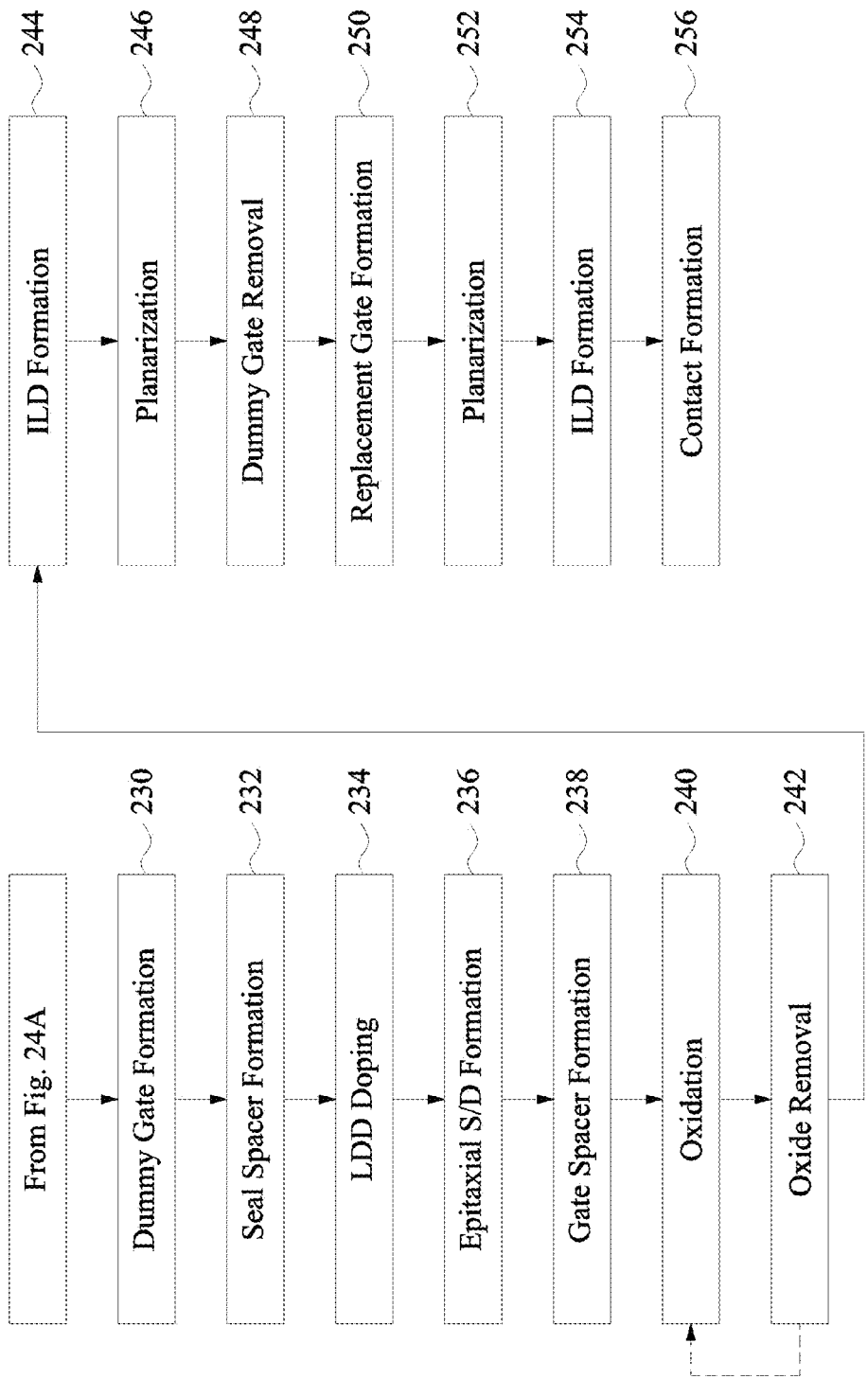

FIGS. 2 through 23C are cross-sectional views of intermediate stages in the manufacturing of FinFETs in accordance with an exemplary embodiment, and FIGS. 24A and 24B are a process flow of the process shown in FIGS. 2 through 23C. FIGS. 2 through 15 illustrate reference cross-section A-A illustrated in FIG. 1, except for multiple FinFETs. In FIGS. 16A through 23C, figures ending with an "A" designation are illustrated along a similar cross-section A-A; figures ending with a "B" designation are illustrated along a similar cross-section B/C-B/C and in a first region on a substrate; and figures ending with a "C" designation are illustrated along a similar cross-section B/C-B/C and in a second region on a substrate.

Figure 2:
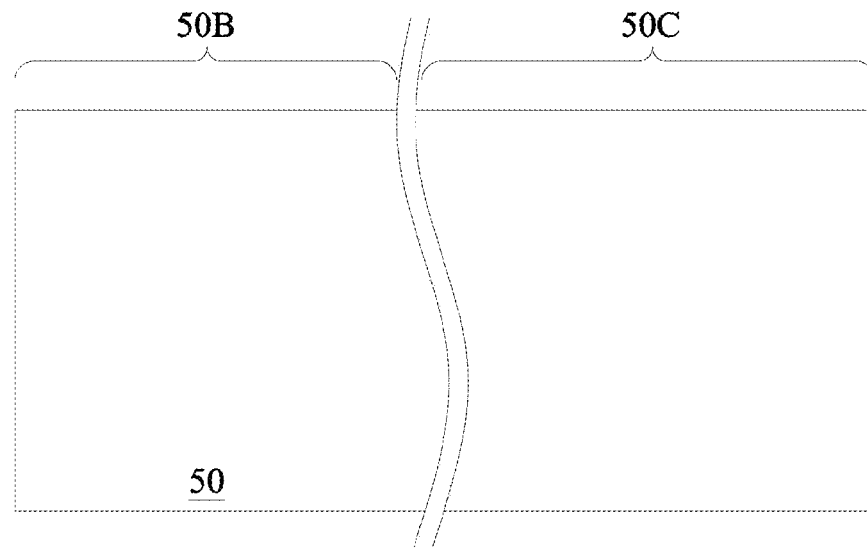
FIGS. 2 through 15, 16A-C, 17A-C, 18A-C, 19A-C, 20A-C, 21A-C, 22A-C, and 23A-C are cross-sectional views of intermediate stages in the manufacturing of FinFETs in accordance with some embodiments.

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B (which corresponds to subsequent figures ending in "B") can be for forming n-type devices, such as NMOS transistors, such as n-type FinFETs. The second region 50C (which corresponds to subsequent figures ending in "C") can be for forming p-type devices, such as PMOS transistors, such as p-type FinFETs.

Figure 3:
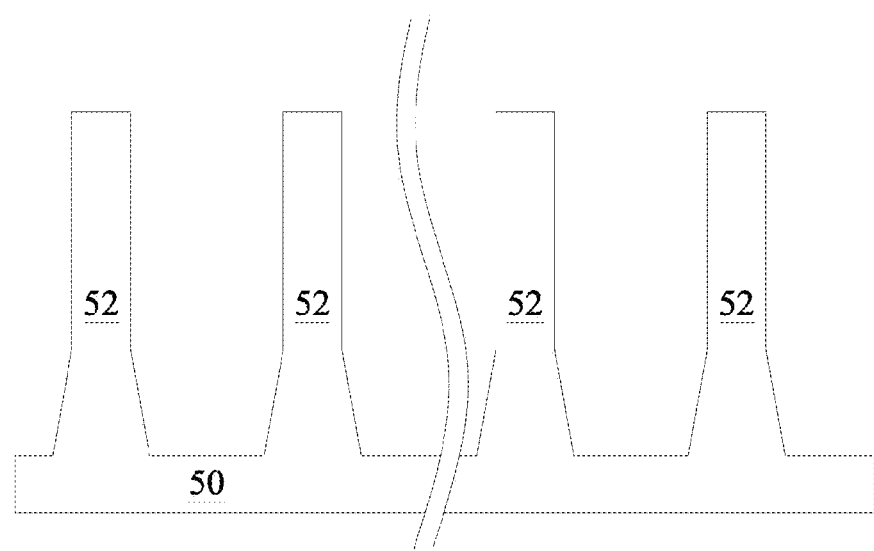
Figure 4:
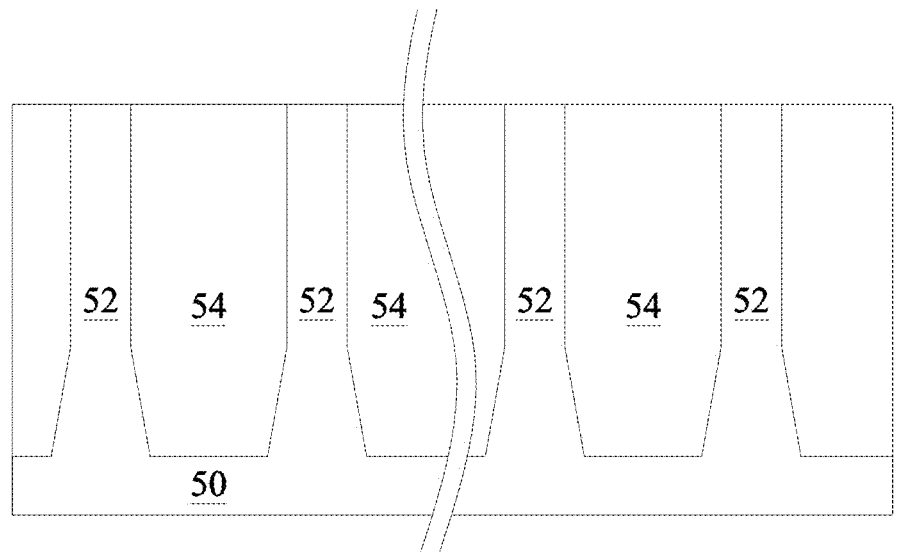

FIGS. 3 and 4 illustrate the formation of fins 52 and isolation regions 54 between neighboring fins 52. In FIG. 3 and in step 200, fins 52 are formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

In FIG. 4 and step 202, an insulation material is formed between neighboring fins 52 to form the isolation regions 54. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. Further in FIG. 4 and in step 204, a planarization process, such as a chemical mechanical polish (CMP), may remove any excess insulation material and form top surfaces of the isolation regions 54 and top surfaces of the fins 52 that are coplanar.

Figure 5:
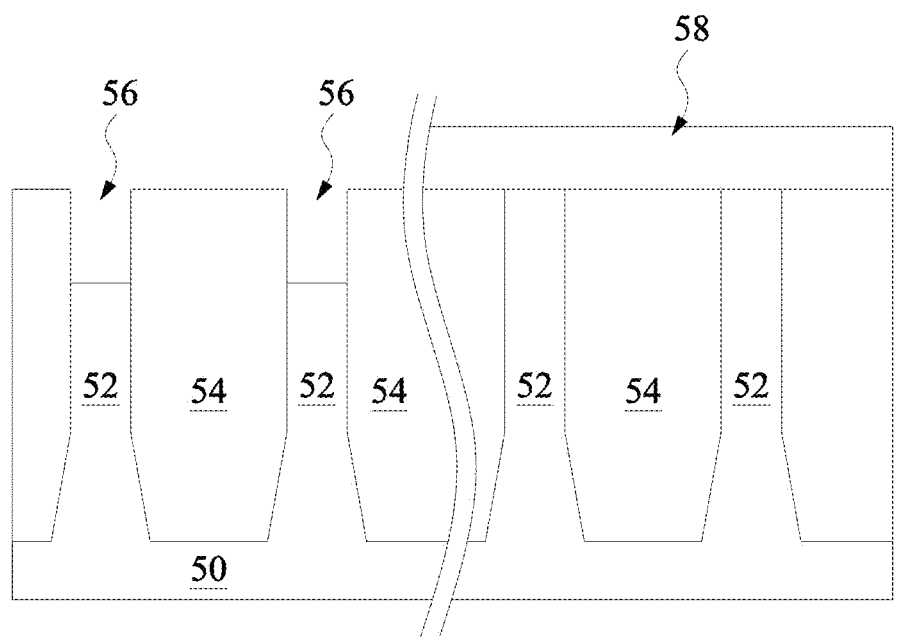

In FIG. 5 and step 206, a mask 58 is formed over the second region 50C of the substrate 50 while the first region 50B is exposed. The mask 58 may be a photoresist patterned by an acceptable photolithography process or the like. Further in FIG. 5 and in step 208, while the mask 58 is on the second region 50C, recesses 56 are formed in the fins 52 and/or the isolation regions 54 in the first region 50B. The recesses 56 may be formed by etching using any acceptable etch process, such as a RIE, NBE, tetramethyalammonium hydroxide (TMAH), ammonium hydroxide (NH$_4$OH), a wet etchant capable of etching silicon with good etch selectivity between silicon and a material of the isolation regions 54, the like, or a combination thereof. The etch may be anisotropic. Surfaces of the fins 52 are exposed as at least portions of the bottom surfaces of the recesses 56. As illustrated, the bottom surfaces of the recesses 56 include all of top surfaces of the fins 52 after an etching process. In the illustrated embodiment, the top surfaces of the fins 52 are each planar. In other embodiments, the top surfaces of the fins 52 may have different configurations.

Figure 6:
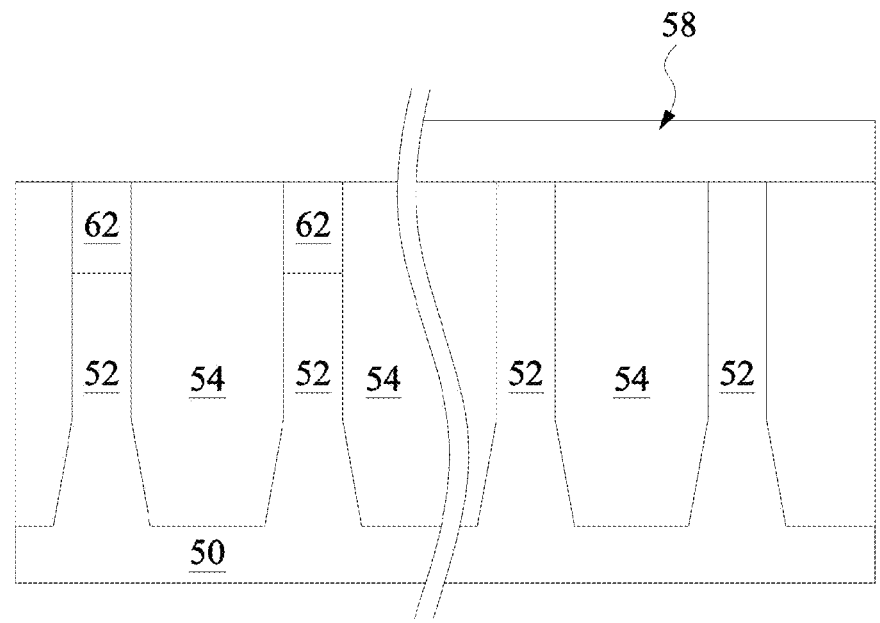

In FIG. 6 and step 210, epitaxial fins, or active areas, are formed in the recesses 56 in the first region 50B. In some embodiments, the epitaxial fins are formed by epitaxially growing a material in the recesses 56, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated, each of the epitaxial fins in the first region 50B comprises an epitaxial portion 62. The epitaxial portions 62 are epitaxially grown on the top surfaces of the fins 52.

In some embodiments, a material of the epitaxial portions 62 is different from a material of the substrate 50 and the fins 52. In some embodiments, the epitaxial portions 62 fins can comprise a III-V compound semiconductor. For example, the available materials for forming III-V compound semiconductor include, but are not limited to, InAs, AlAs, GaAs, GaAsP, InP, GaInP (In %=1-90%), AlInP (In %=1-90%), GaN, InGaAs (In %=1-90%), InAlAs (In %=1-90%), InGaAlAs (In %=1-90%), GaSb, AlSb, AlP, GaP, and the like. In other embodiments, the epitaxial portions 62 can be other material, such as silicon, silicon carbide, germanium, a II-VI compound semiconductor, or the like.

After the epitaxial fins in the first region 50B are formed, the mask 58 is removed. For example, if the mask 58 is a photoresist, the mask 58 may be removed by an appropriate ashing process, such as using an oxygen plasma. In other embodiments, the mask 58 may be removed using an etch, a CMP process, or the like. Further in FIG. 6 and in step 212, a planarization process, such as a CMP process, may be used to form the top surfaces of the epitaxial fins and the isolation regions 54 to be coplanar, for example, when the epitaxial fins are overgrown above the top surface of the isolation regions 54.

Figure 7:
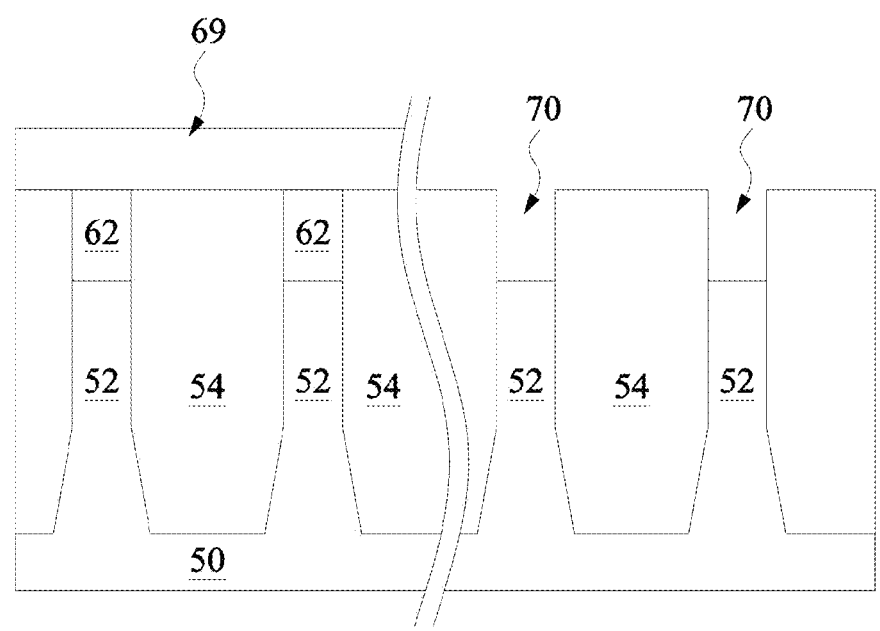

In FIG. 7 and step 214, a mask 69 is formed over the first region 50B of the substrate 50 while the second region 50C is exposed. The mask 69 may be a photoresist patterned by an acceptable photolithography process or the like. Further in FIG. 7 and in step 216, while the mask 69 is on the first region 50B, recesses 70 are formed in the fins 52 and/or the isolation regions 54 in the second region 50C. The recesses 70 may be formed by etching using any acceptable etch process, such as a RIE, NBE, TMAH, ammonium hydroxide, a wet etchant capable of etching silicon with good etch selectivity between silicon and a material of the isolation regions 54, the like, or a combination thereof. The etch may be anisotropic. Surfaces of the fins 52 are exposed as at least portions of the bottom surfaces of the recesses 70. As illustrated, the bottom surfaces of the recesses 70 include all of top surfaces of the fins 52 after an etching process. In the illustrated embodiment, the top surfaces of the fins 52 are each planar. In other embodiments, the top surfaces of the fins 52 may have different configurations.

Figure 8:
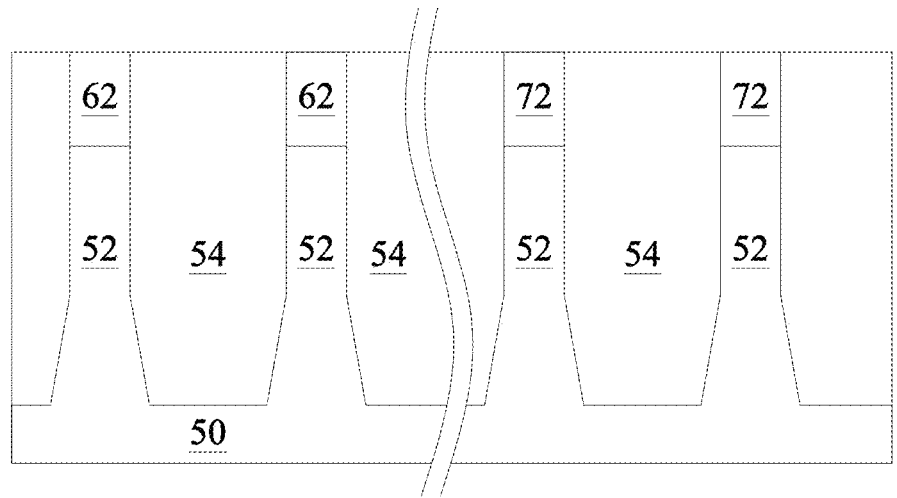

In FIG. 8 and step 218, epitaxial fins are formed in the recesses 70 in the second region 50C. In some embodiments, the epitaxial fins are formed by epitaxially growing a material in the recesses 70, such as by MOCVD, MBE, LPE, VPE, SEG, the like, or a combination thereof. As illustrated, each of the epitaxial fins in the second region 50C comprises an epitaxial portion 72. The epitaxial portions 72 are epitaxially grown on the top surfaces of the fins 52.

In some embodiments, a material of the epitaxial portions 72 is different from a material of the substrate 50 and the fins 52. In some embodiments, the epitaxial portions 72 fins can comprise a III-V compound semiconductor. For example, the available materials for forming III-V compound semiconductor include, but are not limited to, InAs, AlAs, GaAs, GaAsP, InP, GaInP (In %=1-90%), AlInP (In %=1-90%), GaN, InGaAs (In %=1-90%), InAlAs (In %=1-90%), InGaAlAs (In %=1-90%), GaSb, AlSb, AlP, GaP, and the like. In other embodiments, the epitaxial portions 72 can be other material, such as silicon, silicon carbide, germanium, a II-VI compound semiconductor, or the like.

After the epitaxial fins in the second region 50C are formed, the mask 69 is removed. For example, if the mask 69 is a photoresist, the mask 69 may be removed by an appropriate ashing process, such as using an oxygen plasma. In other embodiments, the mask 69 may be removed using an etch, a CMP process, or the like. Further in FIG. 8 and in step 220, a planarization process, such as a CMP process, may be used to form the top surfaces of the epitaxial fins in the first region 50B and the second region 50C and isolation regions 54 to be coplanar, for example, when the epitaxial fins are overgrown above the top surface of the isolation regions 54.

Figure 9:
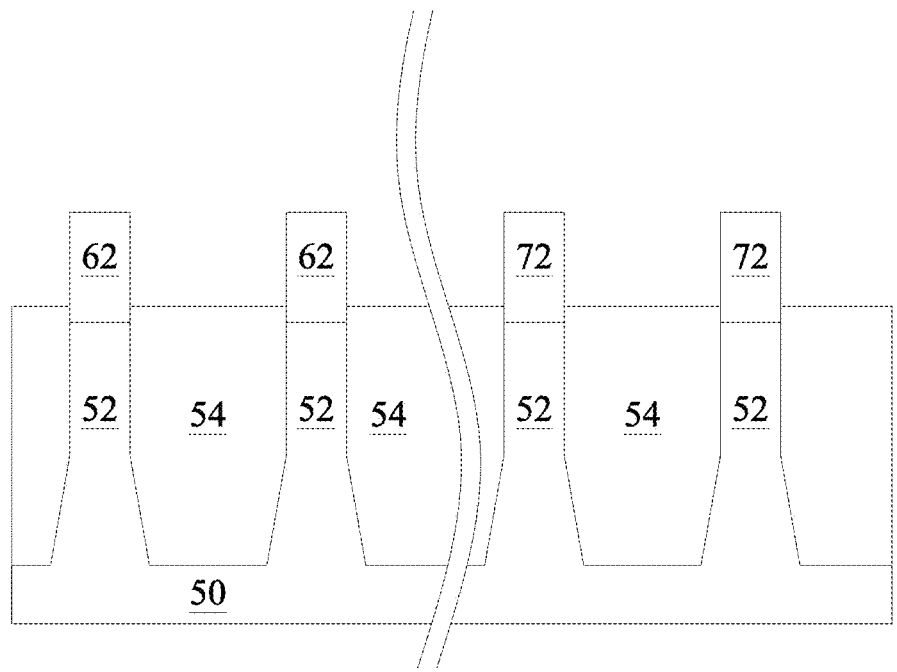

In FIG. 9 and step 222, the isolation regions 54 are recessed, such as to form Shallow Trench Isolation (STI) regions. The isolation regions 54 are recessed such that epitaxial fins in the first region 50B and in the second region 50C protrude from between neighboring insulating isolation regions 54. As illustrated, the top surfaces of the isolation regions 54 are above top surfaces of the fins 52 in the first region 50B and above the top surfaces of the fins 52 in the second region 50C. In other embodiments, the top surfaces of the isolation regions 54 may be below top surfaces of the fins 52 in one or more of the first and second regions 50B and 50C. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

Figure 10:
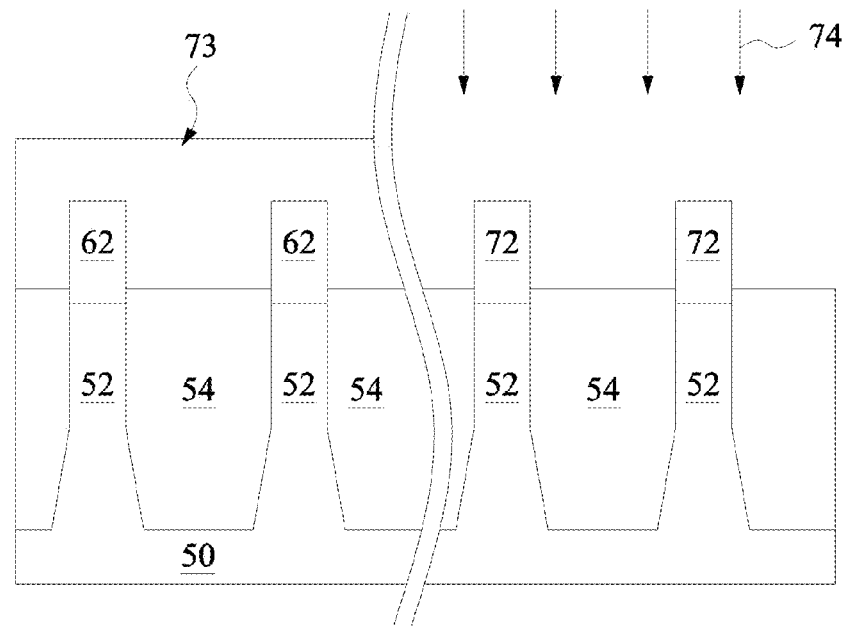
Figure 11:
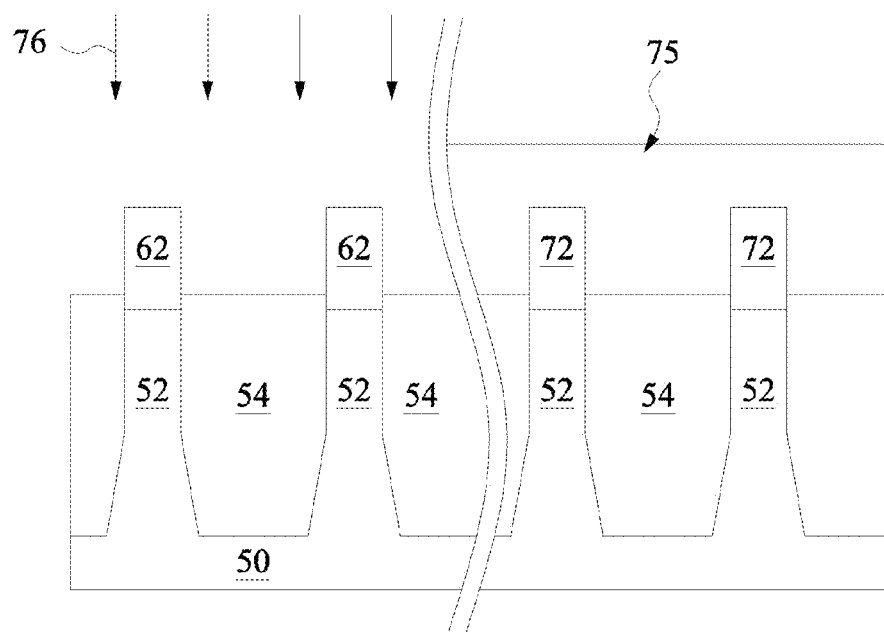

In FIGS. 10 and 11 and step 224, appropriate wells may be formed in the epitaxial fins, fins 52, and/or substrate 50. For example, a P well may be formed in the first region 50B, and an N well may be formed in the second region 50C.

As illustrated in FIG. 10, a photoresist 73 is formed over the epitaxial fins and the isolation regions 54 in the first region 50B. The photoresist 73 is patterned to expose the second region 50C of the substrate 50, such as a PMOS region. The photoresist 73 can be formed by using a spin-on technique and can be patterned using acceptable photolithography techniques. Once the photoresist 73 is patterned, an n-type impurity implant 74 is performed in the second region 50C, and the photoresist 73 may act as a mask to substantially prevent n-type impurities from being implanted into the first region 50B, such as an NMOS region. In the embodiment where the epitaxial portion 62 is a III-V material, the n-type impurities may be selenium, tellurium, silicon, germanium, or the like implanted in the second region. In another embodiment, the n-type impurities may be phosphorus, arsenic, or the like implanted in the second region. After the implant 74, the photoresist 73 is removed, such as by an acceptable ashing process.

As illustrated in FIG. 11, a photoresist 75 is formed over the epitaxial fins and the isolation regions 54 in the second region 50C. The photoresist 75 is patterned to expose the first region 50B of the substrate 50, such as the NMOS region. The photoresist 75 can be formed by using a spin-on technique and can be patterned using acceptable photolithography techniques. Once the photoresist 75 is patterned, a p-type impurity implant 76 may be performed in the first region 50B, and the photoresist 75 may act as a mask to substantially prevent p-type impurities from being implanted into the second region, such as the PMOS region. In the embodiment where the epitaxial portion 72 is a III-V material, the p-type impurities may be beryllium, zinc, cadmium, silicon, germanium, or the like implanted in the first region. In another embodiment, the p-type impurities may be boron, $BF_2$, or the like implanted in the first region. After the implant 76, the second photoresist 75 may be removed, such as by an acceptable ashing process.

After the implants 74 and 76, an anneal may be performed to activate the p-type and n-type impurities that were implanted. The implantations may form a p-well in the first region 50B, e.g., the NMOS region, and an n-well in the second region 50C, e.g., the PMOS region. In some embodiments, the grown materials of the epitaxial fins may be in situ doped during growth, which may obviate the implantations, although in situ and implantation doping may be used together.

A person having ordinary skill in the art will readily understand that the process described with respect to FIGS. 2 through 11 is just one example of how epitaxial fins may be formed. In other embodiments, a dielectric layer can be formed over a top surface of the substrate 50; trenches can be etched through the dielectric layer; the epitaxial fins can be epitaxially grown in the trenches; and the dielectric layer can be recessed such that the homoepitaxial and/or heteroepitaxial structures protrude from the dielectric layer to form epitaxial fins. As discussed above, it may be advantageous to epitaxially grow a material or epitaxial fin structure in the NMOS region different from the material or epitaxial fin structure in the PMOS region.

Figure 12:
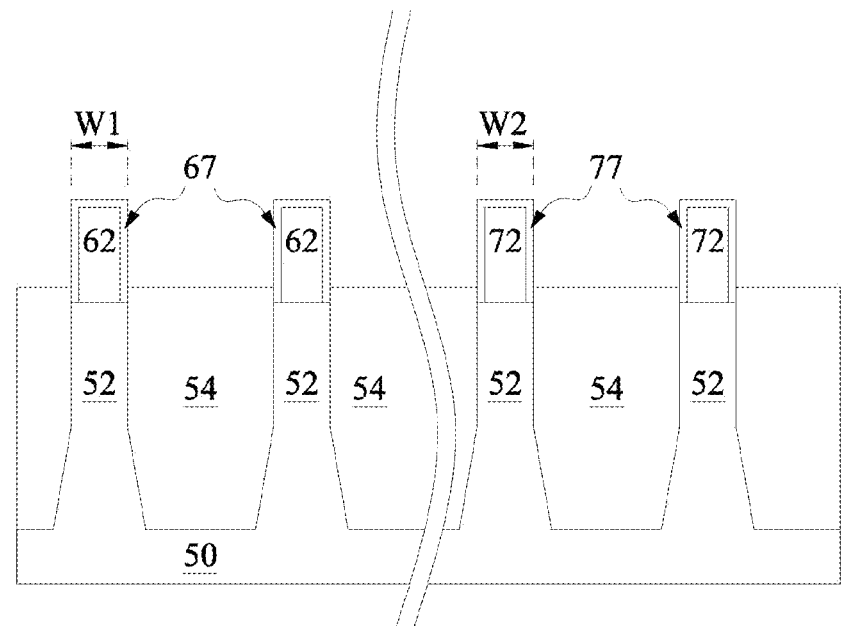
Figure 13:
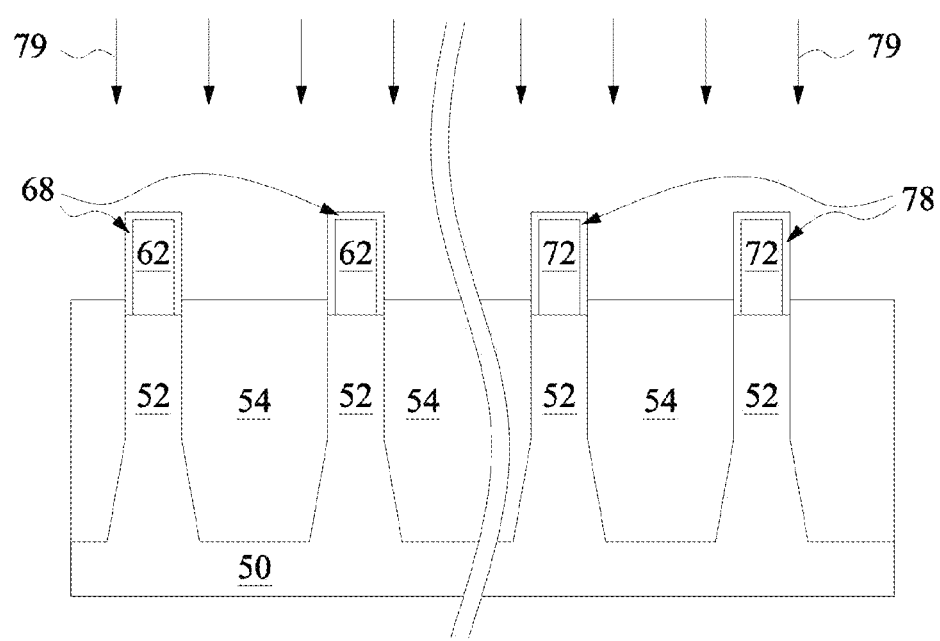
Figure 14:
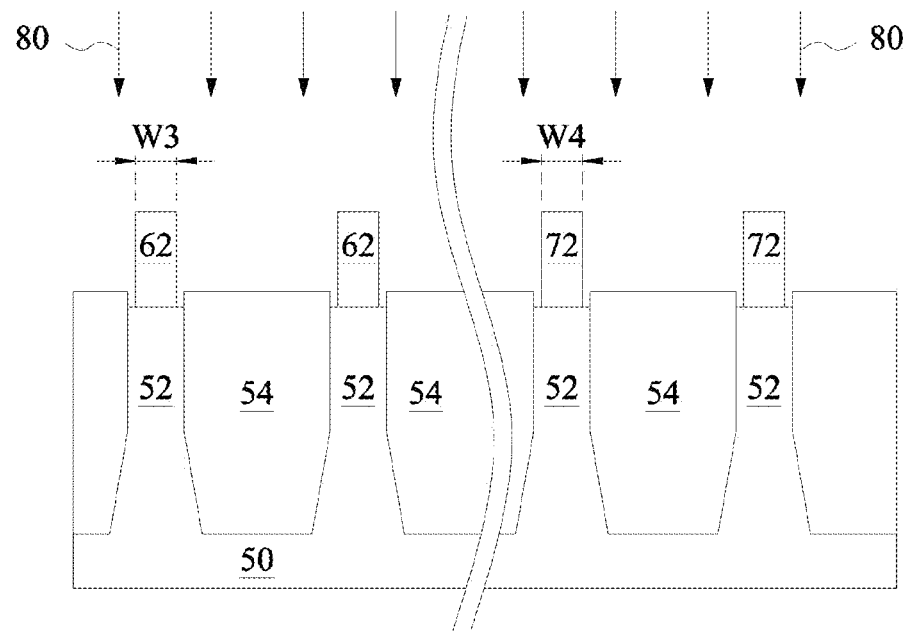

FIGS. 12 through 14 illustrate a process to remove a layer of damaged material from the outer surface of the epitaxial portions 62 and 72. As illustrated in FIG. 12, the epitaxial portions 62 and 72 may have damaged material layers 67 and 77, respectively on the sidewalls and top surfaces of the epitaxial portions 62 and 72. In some embodiments, the damaged material layers 67 and 77 extend below the epitaxial portions 62 and 72 at the interface between the epitaxial portions 62 and 72 and the fins 52 (not shown in these Figures but see FIGS. 27 and 28 below). These damaged material layers may be caused by thermal processes (e.g. anneal processes), oxidation of the epitaxial portions 62 and 72, and/or from plasma processes (e.g. dopant implants). It has been found that the damaged material layers 67 and 77 can cause negatively affect device performance, especially when the devices are scaled down to the smaller technology nodes, such as 10 nm and less. In FIG. 12, the epitaxial fins in the first region 50B and second region 50C have widths W1 and W2, respectively, with these widths including the epitaxial portions 62 and 72 and the damaged material layers 67 and 77, respectively.

In FIG. 13 and step 226, an oxidation process 79 is performed on the exposed portions of the epitaxial fins in the first region 50B and the second region 50C. The oxidation process forms oxide layers 68 and 78. In some embodiments, the formation of the oxide layers 68 and 78 consume at least a part of the damaged material layers 67 and 77. In some embodiments, the formation of the oxide layers 68 and 78 consume at all of the damaged material layers 67 and 77. The oxidation process 79 is a self-limiting process in that it the oxide will stop growing after a certain amount of oxide has grown in the epitaxial portions 62 and 72. In some embodiments, the oxide layers 68 and 78 will self-limit at thicknesses of about 1.1 nm. In some other embodiments, the oxide layers 68 and 78 will self-limit at thicknesses below 1.1 nm, such as down to 0.4 nm. In some other embodiments, the oxide layers 68 and 78 will self-limit at thicknesses of about 5 nm. In some other embodiments, the oxide layers 68 and 78 will grow to have thicknesses greater than 5 nm, such as up to about 45 nm.

The oxidation process 79 may be a wet or dry process. In some embodiments, the oxidation process 79 may use a steam furnace to create the oxidation environment. For example, the substrate 50 including the epitaxial portions 62 and 72 may be placed in a furnace such that the substrate 50 is exposed to a steam environment.

In the wet process embodiment, the generation of the oxidation environment includes $H_2O_2$, $H_2O$, $O_2$/de-ionized water (DIW), $O_3$/DIW, Air/DIW, the like, or a combination thereof at a temperature in a range from about 25° C. to about 80° C. $H_2O_2$ may be provided at a concentration in a range from about 0.003% to about 30%. The $O_2$/DIW, $O_3$/DIW, and/or air/DIW may be provided at a concentration in a range from about 0.02 parts per million (ppm) to about 200 ppm.

In the dry process embodiment, the generation of the oxidation environment includes $H_2O_2$, $H_2O$, $O_2$, $O_3$, Air, NO, $NO_2$, $N_2O$, $SO_2$, CO, $CO_2$, the like, or a combination thereof at a temperature in a range from about 25° C. to about 500° C. The dry process can use either a plasma or a non-plasma process with a gas pressure in a range from about 0.5 mtorr to about 2,280,000 mtorr (3 atmospheres).

The substrate 50 may be exposed to the environment in the oxidation environment for a duration in a range from about a few milliseconds to about 120 minutes, such as about 1 minute. Other oxidation processes may be used.

In FIG. 14 and step 228, the oxide layers 68 and 78 are removed through a removal process 80. In some embodiments, the removal process 80 is an etching process. The etching process can be a dry etch or a wet etch process. In some embodiments, more than one cycle of oxidation and removal (i.e. one oxidation step 226 followed by one removal step 228) may be performed to remove all of the damaged material layers 67 and 77 from the epitaxial portions 62 and 72, respectively. For example, the cycle of steps 226 and 228 may be repeated five times, ten times, fifteen times, or more times as necessary.

In the wet etch embodiment, the chemicals used can be acids (e.g. pH<7) such as organic or inorganic acids. In some embodiments, wet etch process includes HCl, $H_2SO_4$, citric acid, HF, $H_2CO_3$, $HNO_3$, $H_3PO_4$, hydrochloric acid-hydrogen peroxide mixture (HPM), sulfuric acid-hydrogen peroxide mixture (SPM), tartaric acid, the like, or a combination thereof. The chemicals of the wet etch process can operate with a dilute matrix such as water, isopropyl alcohol, dimethyl sulfoxide, propylene carbonate, the like or a combination thereof. $H_2SO_4$ may be provided at a concentration in a range from about 0.003% to about 98%. $H_2O_2$ may be provided at a concentration in a range from about 0.003% to about 30%. HCl may be provided at a concentration in a range from about 0.0038% to about 38%. HF may be provided at a concentration in a range from about 0.01% to about 70%. In some embodiments, wet etch process is performed at a temperature in a range from about 25° C. to about 200° C.

In the dry etch embodiment, the etch process includes fluorine, chlorine, and/or bromine based gases, such as $SF_6$, $NF_3$, $Cl_2$, HBr, the like, or a combination thereof at a temperature in a range from about 25° C. to about 500° C. The dry etch process can use either a plasma or a non-plasma process with a gas pressure in a range from about 0.5 mtorr to about 2,280,000 mtorr (3 atmospheres).

The removal process 80 is selective to the oxide layers 68 and 78 such that it will remove the oxide layers 68 and 78 without removing the epitaxial portions 62 and 72 and the STI regions 54. As discussed above, the thickness of the oxide layers 68 and 78 can be formed to have specific thicknesses (e.g. 1.1 nm, 5 nm, >5 nm), and hence, the removal process 80 can remove specific thicknesses of the damaged material layers 67 and 77 until all of the damaged material layers 67 and 77 are removed. For example, in an embodiment where the oxidation process 79 is a wet oxidation process including $H_2O_2$ and the removal process 80 is a wet etch process, one cycle of oxidation and removal will remove a 1.1 nm thick layer of the damaged material from of the exposed surfaces. This cycle may be repeated as necessary.

As illustrated in FIG. 14, after one or more cycles of steps 226 and 226, the epitaxial portions 62 and 72 have widths W3 and W4, respectively that are less than the widths W1 and W2, respectively of the epitaxial portions before one or more cycles of steps 226 and 226 were performed.

Although FIGS. 12 through 14 illustrate the oxidation and removal processes being performed on the first region 50B and the second region 50C simultaneously, the oxidation and removal processes may be performed separately on each of the regions by utilizing masking layers. In some embodiments, the oxidation and removal processes are not performed on one of the first region 50B and the second region 50C.

Figure 15:
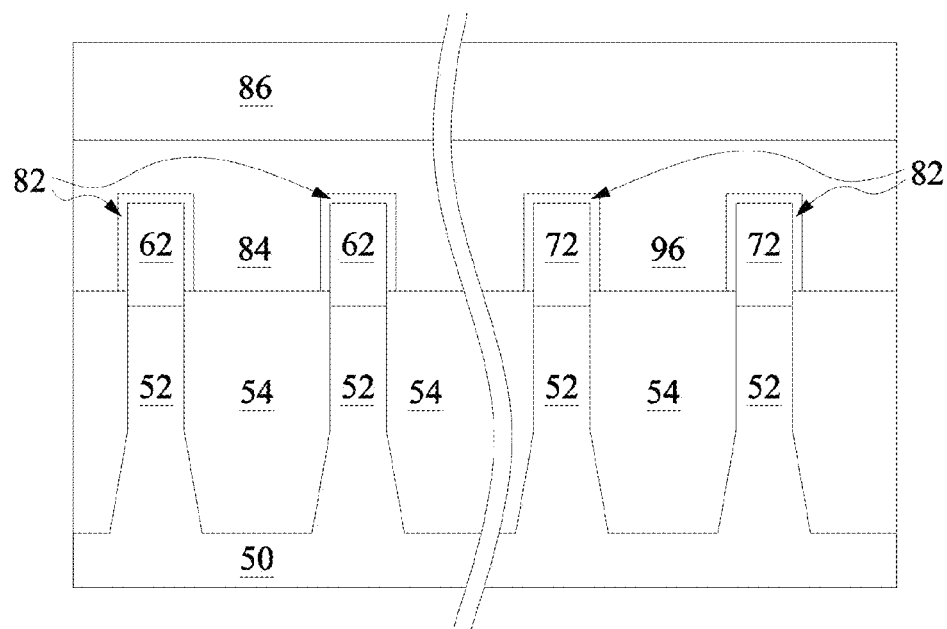

In FIG. 15 and step 230, a dummy dielectric layer 82 is formed on the epitaxial fins. The dummy dielectric layer 82 may be, for example, silicon oxide, silicon nitride, a combination thereof, or the like, and may be deposited or thermally grown according to acceptable techniques. A dummy gate layer 84 is formed over the dummy dielectric layer 82, and a mask layer 86 is formed over the dummy gate layer 84. The dummy gate layer 84 may be deposited over the dummy dielectric layer 82 and then planarized, such as by a CMP. The mask layer 86 may be deposited over the dummy gate layer 84. The dummy gate layer 84 may be comprise, for example, polysilicon, although other materials that have a high etching selectivity from the etching of isolation regions 54 may also be used. The mask layer 86 may comprise, for example, silicon nitride or the like. In this example, a single dummy gate layer 84 and a single mask layer 86 are formed across the first region 50B and the second region 50C. In other embodiments, separate dummy gate layers may be formed in the first region 50B and the second region 50C, and separate mask layers may be formed in the first region 50B and the second region 50C.

Figure 16A:
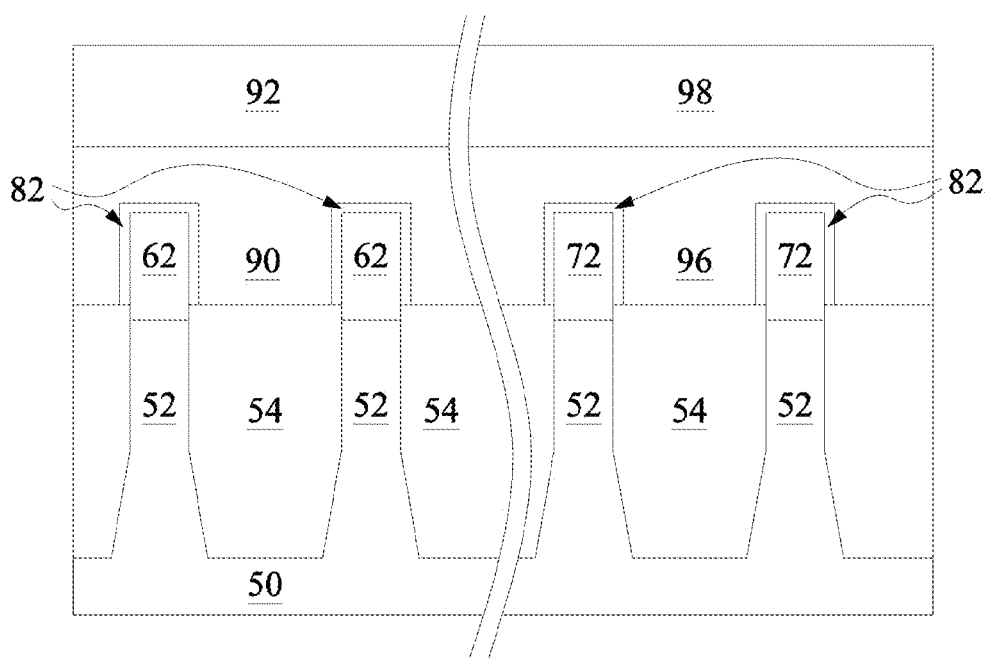
Figure 16B:
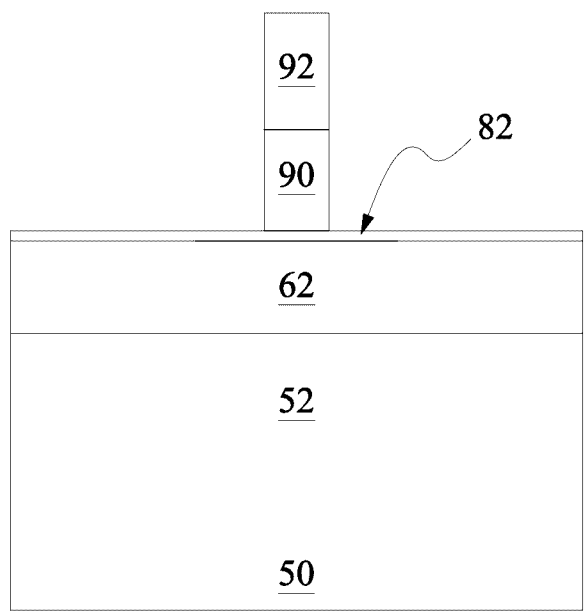
Figure 16C:
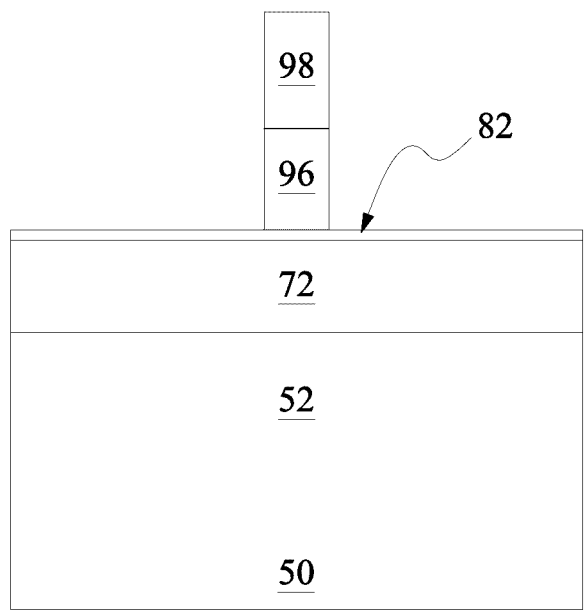

In FIGS. 16A, 16B, and 16C and continuing in step 230, the mask layer 86 may be patterned using acceptable photolithography and etching techniques to form masks 92 in the first region 50B (as illustrated in FIG. 16B) and masks 98 in the second region 50C (as illustrated in FIG. 16C). The pattern of the masks 92 and 98 then may be transferred to the dummy gate layer 84 and dummy dielectric layer 82 by an acceptable etching technique to form dummy gates 90 in the first region 50B and dummy gates 96 in the second region 50C. The dummy gates 90 and 96 cover respective channel regions of the epitaxial fins. The dummy gates 90 and 96 may also have a lengthwise direction substantially perpendicular to the lengthwise direction of respective epitaxial fins.

Figure 17A:
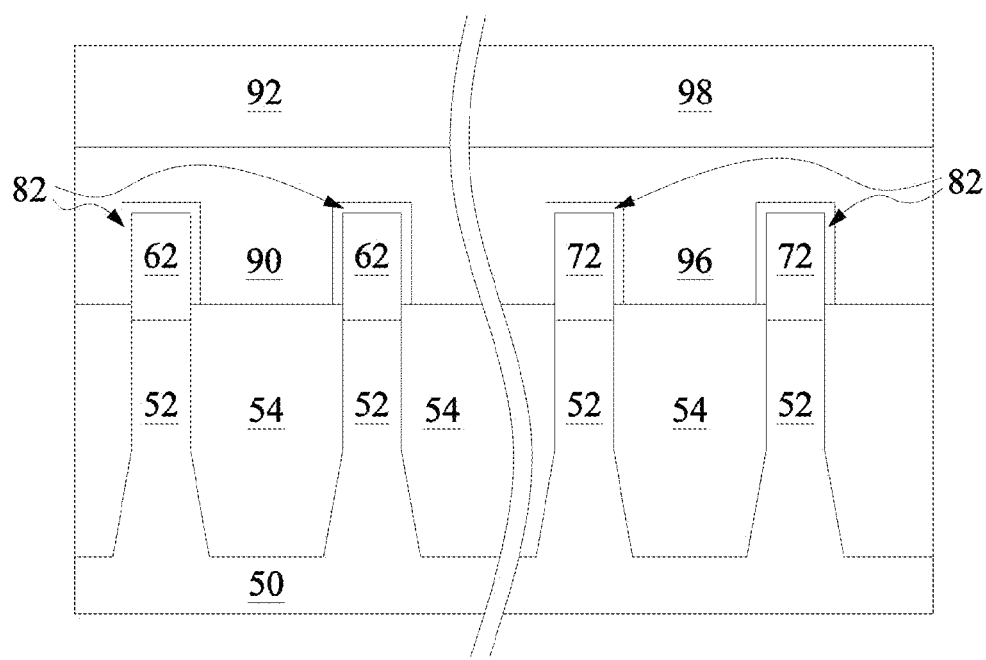
Figure 17B:
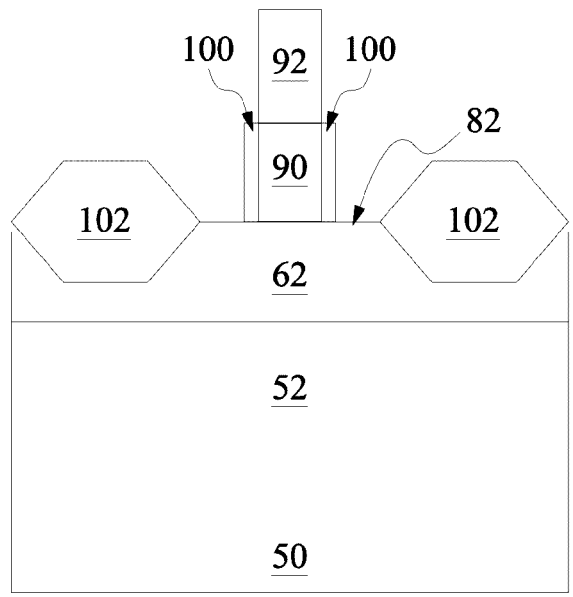
Figure 17C:
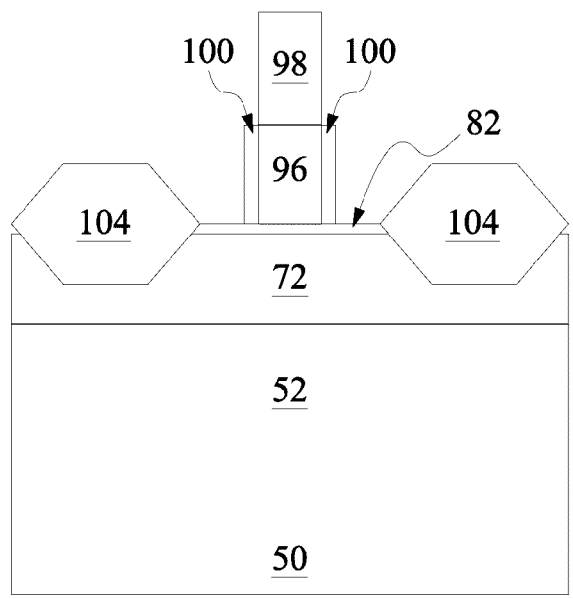

In FIGS. 17A, 17B, and 17C and step 232, gate seal spacers 100 can be formed on exposed surfaces of respective dummy gates 90 and 96 and/or epitaxial portions 62 and 72. A thermal oxidation or a deposition followed by an anisotropic etch may form the gate seal spacers 100.

In step 234, implants for lightly doped source/drain (LDD) regions may be performed. Similar to the implants discussed above in FIGS. 13 and 14, a mask, such as a photoresist, may be formed over the first region 50B, e.g., NMOS region, while exposing the second region 50C, e.g., PMOS region, and p-type impurities may be implanted into the exposed epitaxial fins in the second region 50C. The mask may then be removed. Subsequently, a mask, such as a photoresist, may be formed over the second region 50C while exposing the first region 50B, and n-type impurities may be implanted into the exposed epitaxial fins in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further in FIGS. 17A, 17B, and 17C and in step 236, epitaxial source/drain regions 102 and 104 are formed in the epitaxial fins. In the first region 50B, epitaxial source/drain regions 102 are formed in the epitaxial portions 62 such that each dummy gate 90 is disposed between respective neighboring pairs of the epitaxial source/drain regions 102. In some embodiments that epitaxial source/drain regions 102 may extend through the epitaxial portions 62 and into the fins 52. In the second region 50C, epitaxial source/drain regions 104 are formed in the epitaxial portions 72 such that each dummy gate 96 is disposed between respective neighboring pairs of the epitaxial source/drain regions 104. In some embodiments that epitaxial source/drain regions 104 may extend through the epitaxial portions 72 into the fins 52.

Epitaxial source/drain regions 102 in the first region 50B, e.g., the NMOS region, may be formed by masking the second region 50C, e.g., the PMOS region, and conformally depositing a dummy spacer layer in the first region 50B followed by an anisotropic etch to form dummy gate spacers (not shown) along sidewalls of the dummy gates 90 and/or gate seal spacers 100 in the first region 50B. Then, source/drain regions of the epitaxial fins in the first region 50B are etched to form recesses. The epitaxial source/drain regions 102 in the first region 50B are epitaxially grown in the recesses. The epitaxial source/drain regions 102 may comprise any acceptable material, such as appropriate for n-type FinFETs. The epitaxial source/drain regions 102 may have surfaces raised from respective surfaces of the epitaxial portions 62 and may have facets. Subsequently, the dummy gate spacers in the first region 50B are removed, for example, by an etch, as is the mask on the second region 50C.

Epitaxial source/drain regions 104 in the second region 50C, e.g., the PMOS region, may be formed by masking the first region 50B, e.g., the NMOS region, and conformally depositing a dummy spacer layer in the second region 50C followed by an anisotropic etch to form dummy gate spacers (not shown) along sidewalls of the dummy gates 96 and/or gate seal spacers 100 in the second region 50C. Then, source/drain regions of the epitaxial fins in the second region 50C are etched to form recesses. The epitaxial source/drain regions 104 in the second region 50C are epitaxially grown in the recesses. The epitaxial source/drain regions 104 may comprise any acceptable material, such as appropriate for p-type FinFETs. For example, if the upper epitaxial portion 72 is silicon, the epitaxial source/drain regions 104 may comprise SiGe, SiGeB, Ge, GeSn, or the like. The epitaxial source/drain regions 104 may have surfaces raised from respective surfaces of the upper epitaxial portions 72 and may have facets. Subsequently, the dummy gate spacers in the second region 50C are removed, for example, by an etch, as is the mask on the first region 50B.

Figure 18A:
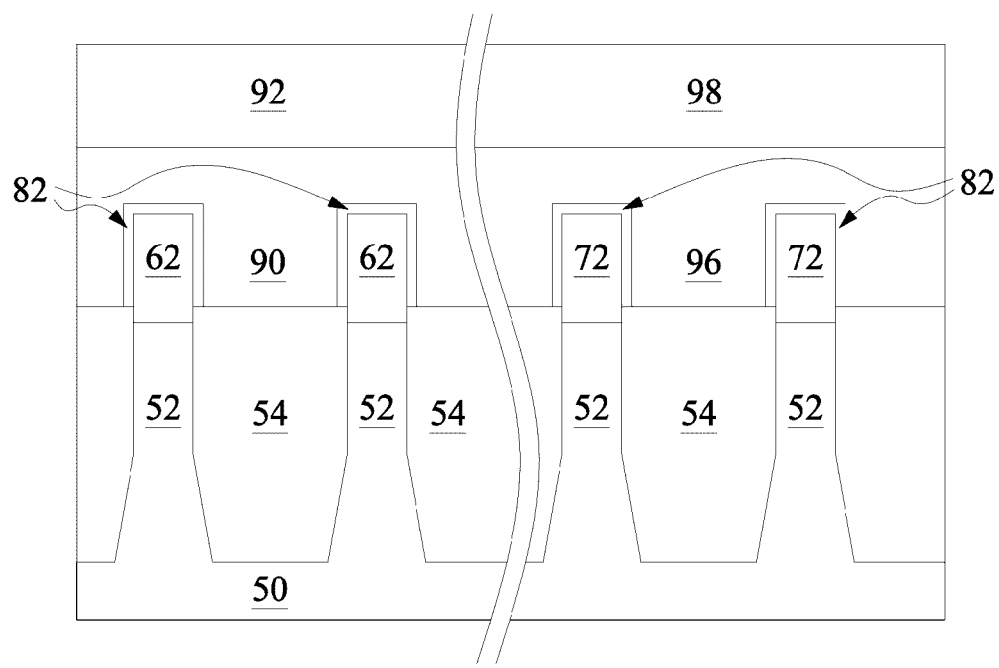
Figure 18B:
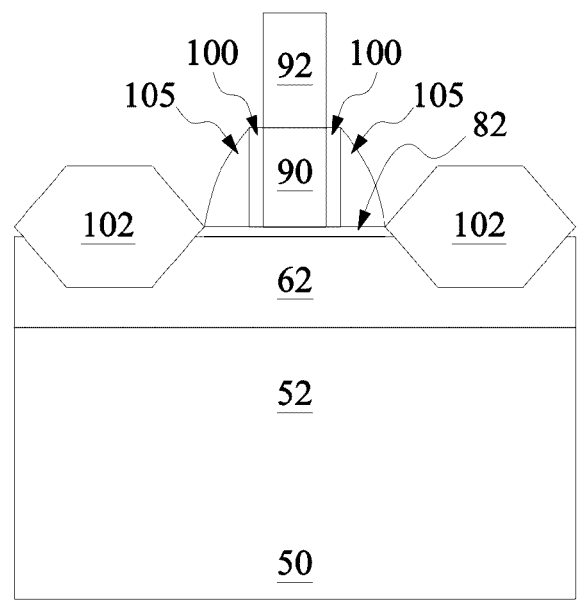
Figure 18C:
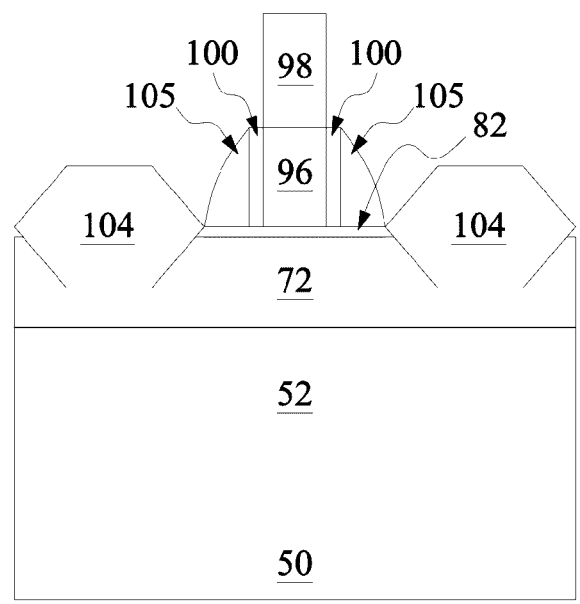

In FIGS. 18A, 18B, and 18C and step 238, gate spacers 105 are formed on the gate seal spacers 100 along sidewalls of the dummy gates 90 and 96. The gate spacers 105 may be formed by conformally depositing a material and subsequently anisotropically etching the material. The material of the gate spacers 105 may be silicon nitride, SiCN, a combination thereof, or the like.

The epitaxial source/drain regions 102 and 104 and/or epitaxial fins may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type impurities for source/drain regions in the first region 50B, e.g., the NMOS region, may be any of the n-type impurities previously discussed, and the p-type impurities for source/drain regions in the second region 50C, e.g., the PMOS region, may be any of the p-type impurities previously discussed. In other embodiments, the epitaxial source/drain regions 102 and 104 may be in situ doped during growth.

In steps 240 and 242, an oxidation and removal process may be performed on the epitaxial source/drain regions 102 and 104. The epitaxial source/drain regions 102 and 104 may have damaged material layers (not shown), respectively on the exposed sidewalls and top surfaces of the epitaxial source/drain regions 102 and 104. These damaged material layers may be caused by thermal processes (e.g. anneal processes), oxidation, and/or from plasma processes (e.g. dopant implants). As discussed above, the damaged material layers can cause negatively affect device performance.

The steps 240 and 242 are similar to the steps 226 and 228 described above in reference to FIGS. 12 through 14 and the descriptions are not repeated herein. In some embodiments, the steps 240 and 242 are skipped and the oxidation and removal processes are not performed on the epitaxial source/drain regions 102 and 104.

Figure 19A:
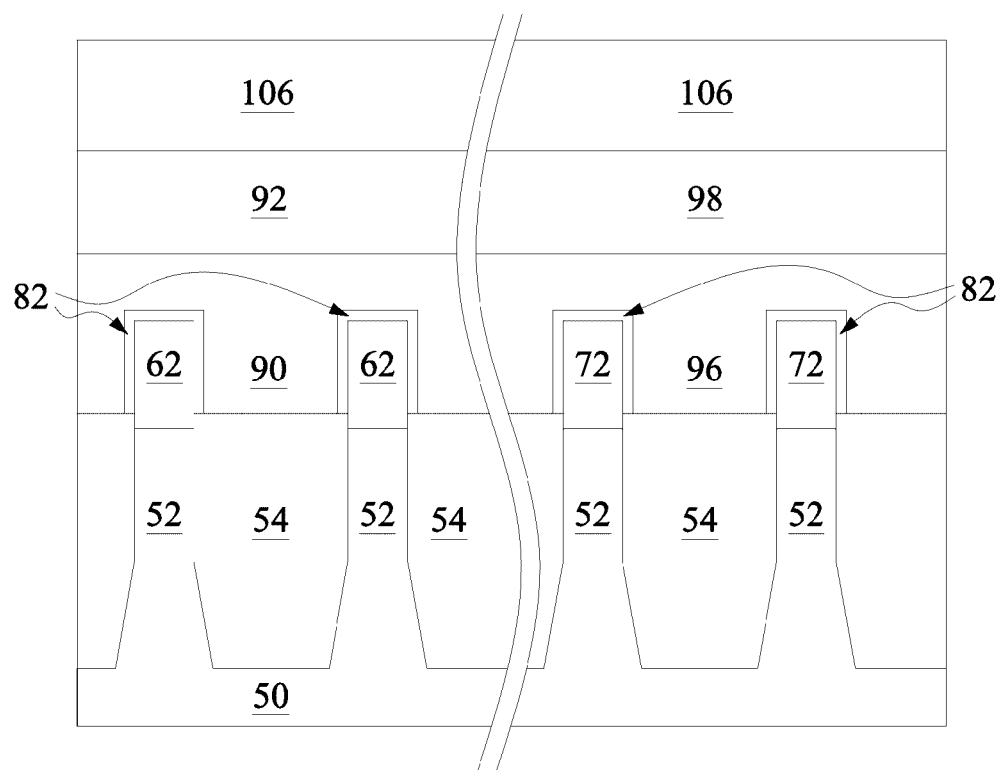
Figure 19B:
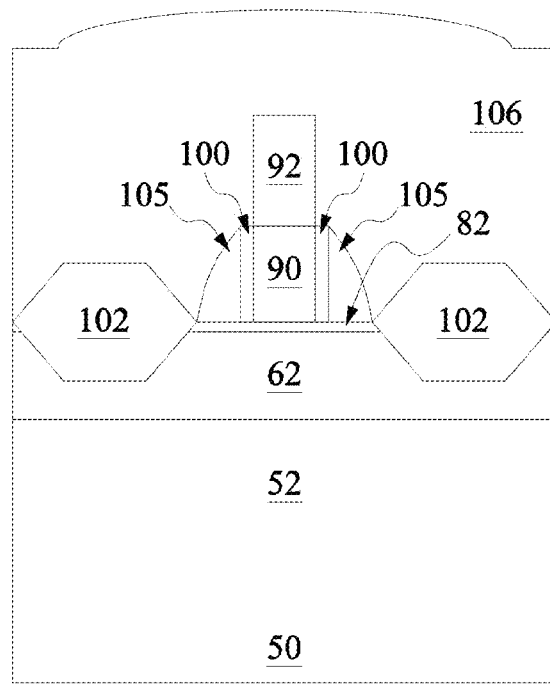
Figure 19C:
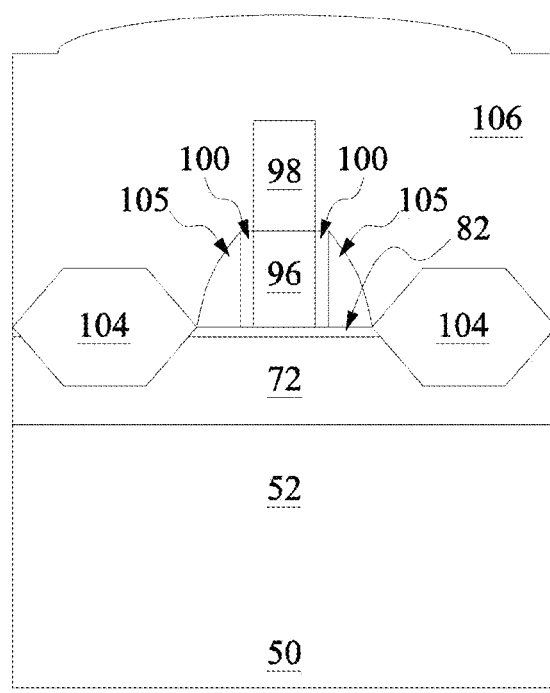

In FIGS. 19A, 19B, and 19C and step 244, an Inter-Layer Dielectric (ILD) 106 is deposited over the structure illustrated in FIGS. 18A, 18B, and 18C. ILD 106 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as chemical vapor deposition (CVD), plasma-enhanced CVD (PECVD), or FCVD.

Figure 20A:
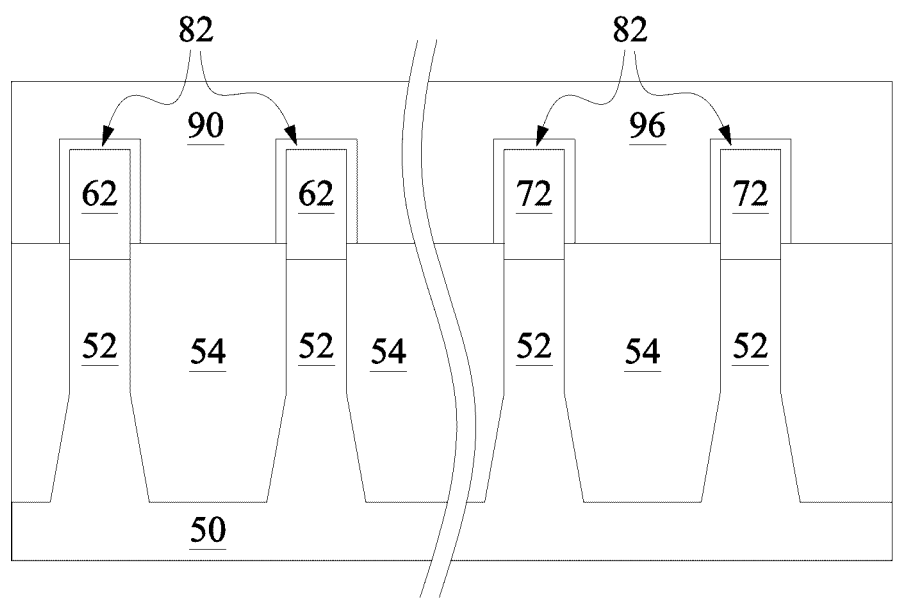
Figure 20B:
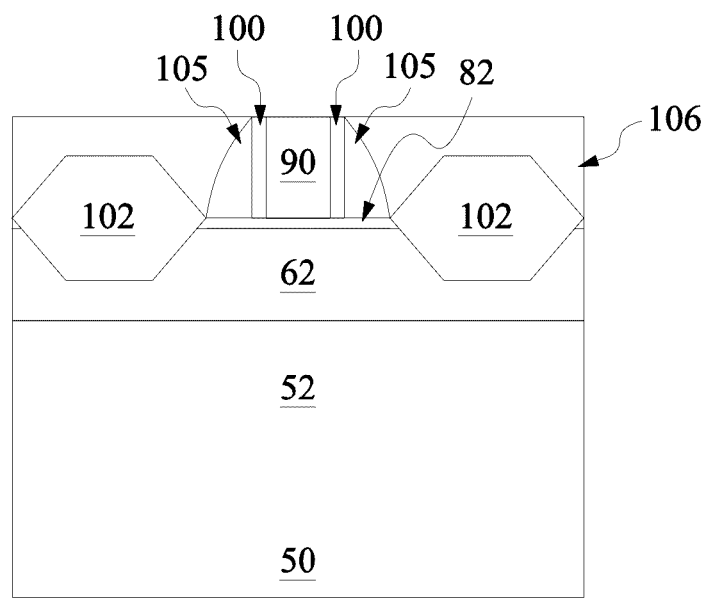
Figure 20C:
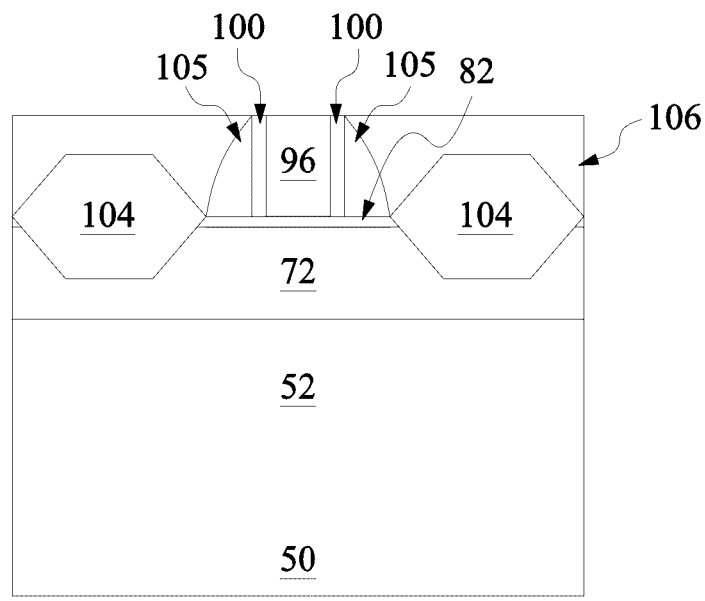

In FIGS. 20A, 20B, and 20C and step 246, a planarization process, such as a CMP, may be performed to level the top surface of ILD 106 with the top surfaces of the dummy gates 90 and 96. The CMP may also remove the masks 92 and 98 on the dummy gates 90 and 96. Accordingly, top surfaces of the dummy gates 90 and 96 are exposed through the ILD 106.

Figure 21A:
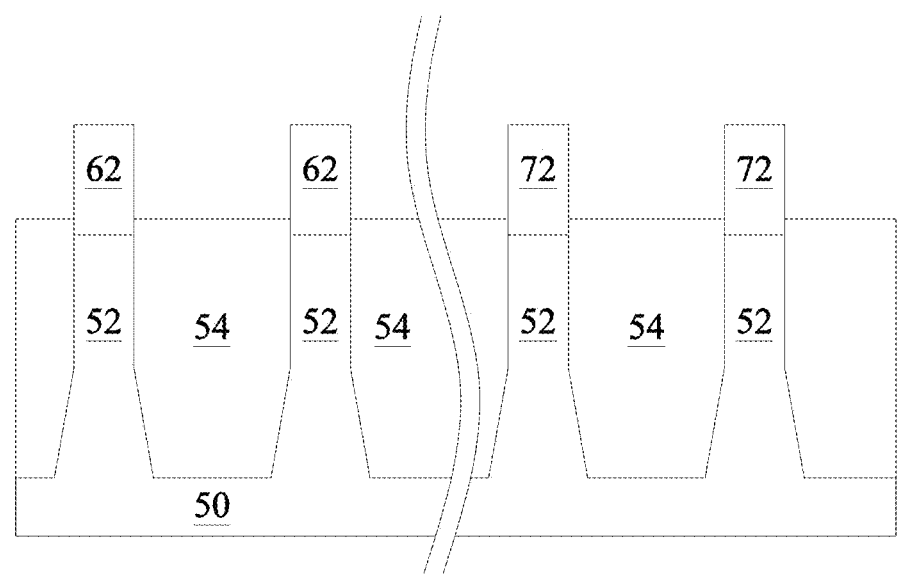
Figure 21B:
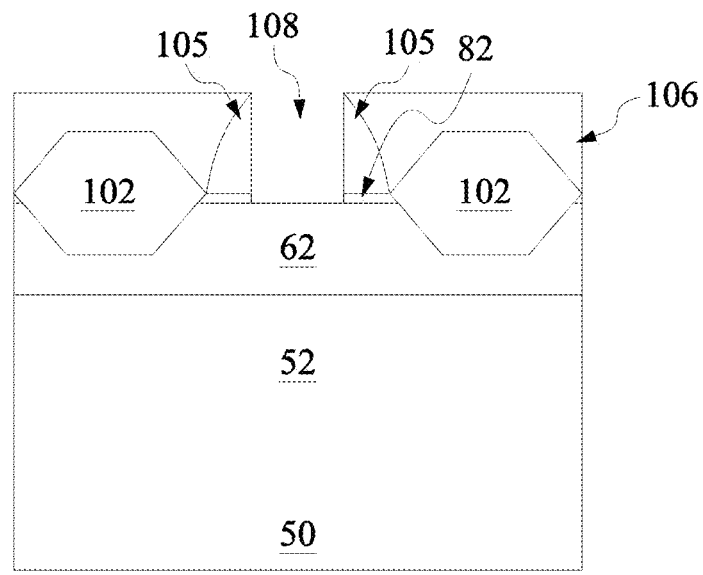
Figure 21C:
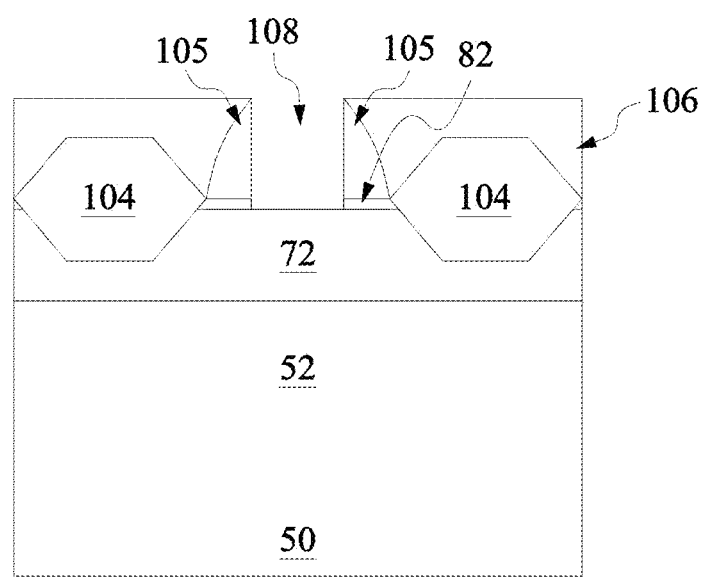

In FIGS. 21A, 21B, and 21C and step 248, the dummy gates 90 and 96, gate seal spacers 100, and portions of the dummy dielectric layer 82 directly underlying the dummy gates 90 and 96 are removed in an etching step(s), so that recesses 108 are formed. Each recess 108 exposes a channel region of a respective epitaxial fin. Each channel region is disposed between neighboring pairs of epitaxial source/drain regions 102 and 104. During the removal, the dummy dielectric layer 82 may be used as an etch stop layer when the dummy gates 90 and 96 are etched. The dummy dielectric layer 82 and gate seal spacers 100 may then be removed after the removal of the dummy gates 90 and 96.

Figure 22A:
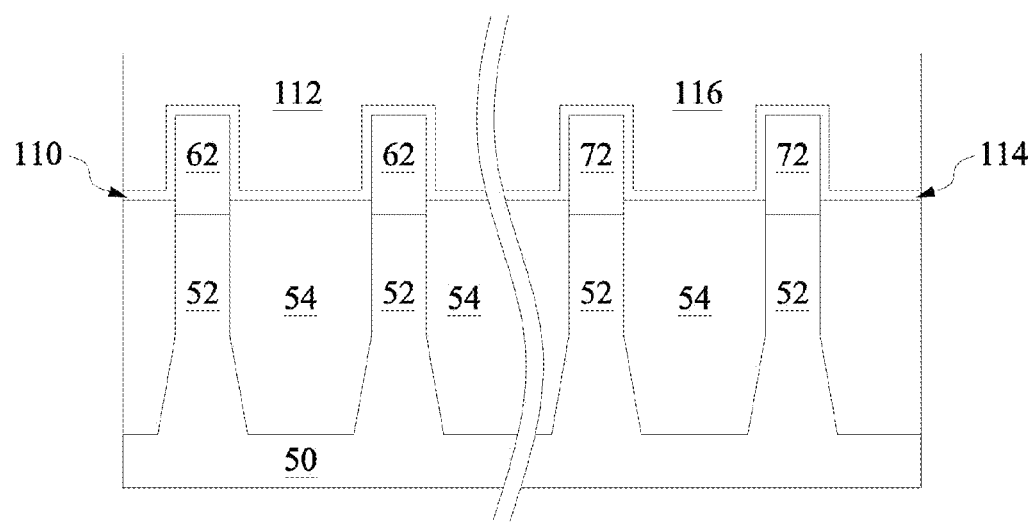
Figure 22B:
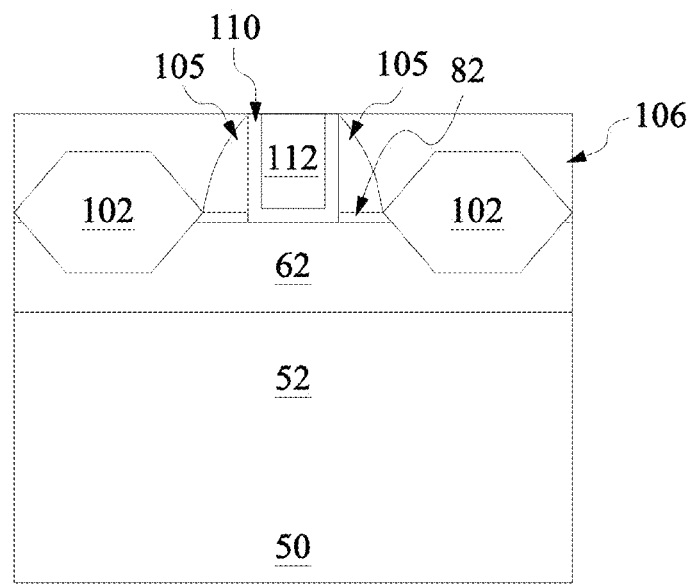
Figure 22C:
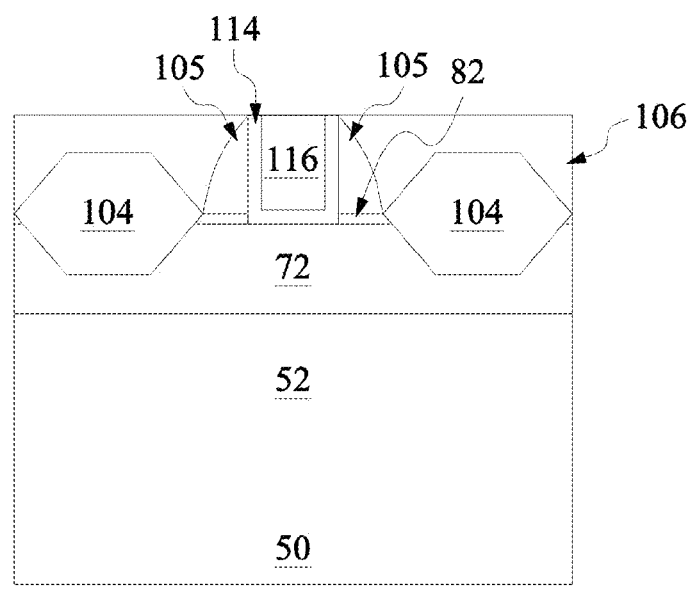

In FIGS. 22A, 22B, and 22C and step 250, gate dielectric layers 110 and 114 and gate electrodes 112 and 116 are formed for replacement gates. Gate dielectric layers 110 and 114 are deposited conformally in recesses 108, such as on the top surfaces and the sidewalls of the epitaxial fins and on sidewalls of the gate spacers 105, and on a top surface of the ILD 106. In accordance with some embodiments, gate dielectric layers 110 and 114 comprise silicon oxide, silicon nitride, or multilayers thereof. In other embodiments, gate dielectric layers 110 and 114 comprise a high-k dielectric material, and in these embodiments, gate dielectric layers 110 and 114 may have a k value greater than about 7.0, and may include a metal oxide or a silicate of Hf, Al, Zr, La, Mg, Ba, Ti, Pb, and combinations thereof. The formation methods of gate dielectric layers 110 and 114 may include Molecular-Beam Deposition (MBD), Atomic Layer Deposition (ALD), PECVD, and the like.

Next, gate electrodes 112 and 116 are deposited over gate dielectric layers 110 and 114, respectively, and fill the remaining portions of the recesses 108. Gate electrodes 112 and 116 may comprise a metal-containing material such as TiN, TaN, TaC, Co, Ru, Al, combinations thereof, or multilayers thereof. After the filling of gate electrodes 112 and 116, in step 252, a planarization process, such as a CMP, may be performed to remove the excess portions of gate dielectric layers 110 and 114 and the material of gate electrodes 112 and 116, which excess portions are over the top surface of ILD 106. The resulting remaining portions of material of gate electrodes 112 and 116 and gate dielectric layers 110 and 114 thus form replacement gates of the resulting FinFETs.

The formation of the gate dielectric layers 110 and 114 may occur simultaneously such that the gate dielectric layers 110 and 114 comprise the same materials, and the formation of the gate electrodes 112 and 116 may occur simultaneously such that the gate electrodes 112 and 116 comprise the same materials. However, in other embodiments, the gate dielectric layers 110 and 114 may be formed by distinct processes, such that the gate dielectric layers 110 and 114 may comprise different materials, and the gate electrodes 112 and 116 may be formed by distinct processes, such that the gate electrodes 112 and 116 may comprise different materials. Various masking steps may be used to mask and expose appropriate regions when using distinct processes.

In FIGS. 23A, 23B, and 23C, an ILD 118 is deposited over ILD 106 in step 254, and contacts 120 and 122 are formed through ILD 118 and ILD 106 in step 256. ILD 118 is formed of a dielectric material such as PSG, BSG, BPSG, USG, or the like, and may be deposited by any suitable method, such as CVD and PECVD. Openings for contacts 120 and 122 are formed through the ILDs 106 and 118. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 118. The remaining liner and conductive material form contacts 120 and 122 in the openings. An anneal process may be performed to form a silicide at the interface between the epitaxial source/drain regions 102 and 104 and the contacts 120 and 122, respectively. Contacts 120 are physically and electrically coupled to the epitaxial source/drain regions 102, and contacts 122 are physically and electrically coupled to the epitaxial source/drain regions 104.

Although not explicitly shown, a person having ordinary skill in the art will readily understand that further processing steps may be performed on the structure in FIGS. 23A, 23B, and 23C. For example, various Inter-Metal Dielectrics (IMDs) and their corresponding metallizations may be formed over ILD 118.

FIGS. 25 through 32 and 33A-C are cross-sectional views of intermediate stages in the manufacturing of a Gate All-Around (GAA) device in accordance with some embodiments. In this embodiment, the device is a GAA device, such has a horizontal GAA device (sometimes referred to as a horizontal nanowire device). In other embodiments, the embodiments of the present disclosure can be utilized in a vertical GAA device. Details of the previous embodiments that are similar are not repeated herein.

FIGS. 25 through 32 illustrate reference cross-section A-A illustrated in FIG. 1, except for a GAA device instead of a FinFET device. In FIGS. 33A, 33B, and 33C, figures ending with an "A" designation are illustrated along a similar cross-section A-A; figures ending with a "B" designation are illustrated along a similar cross-section B/C-B/C and in the first region on a substrate; and figures ending with a "C" designation are illustrated along a similar cross-section B/C-B/C and in the second region on a substrate.

Figure 25:
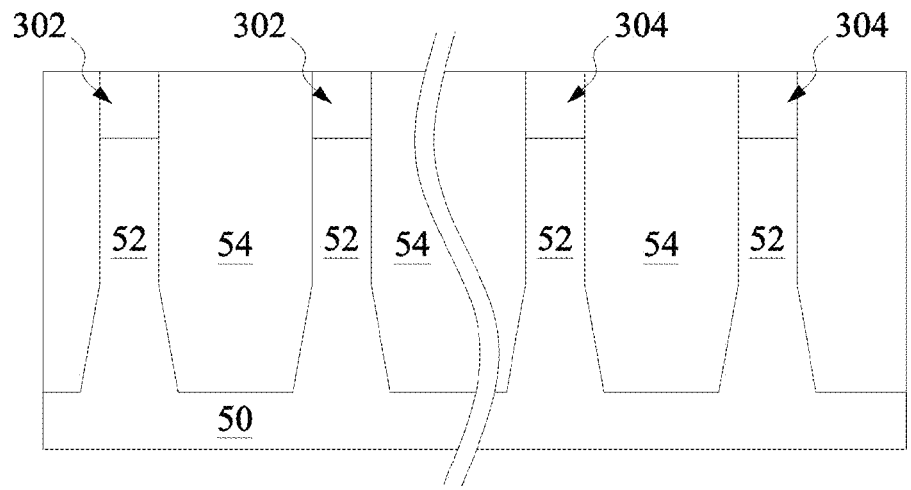

FIG. 25 illustrates an intermediate stage of manufacturing a GAA device in accordance with some embodiments. The structure of FIG. 25 is similar to the structure illustrated in FIG. 8 described above with the epitaxial portions 302 and 304 being similar to the epitaxial portions 62 and 72 and their descriptions are not repeated herein. In this embodiment, the epitaxial portions 302 and 304 may have an aspect ratio (height/width) closer to one than the epitaxial portions 62 and 72 described above. This is to allow the epitaxial portions 302 and 304 to subsequently form nanowires that are approximately round in shape in this cross-sectional view (see FIG. 31).

Figure 26:
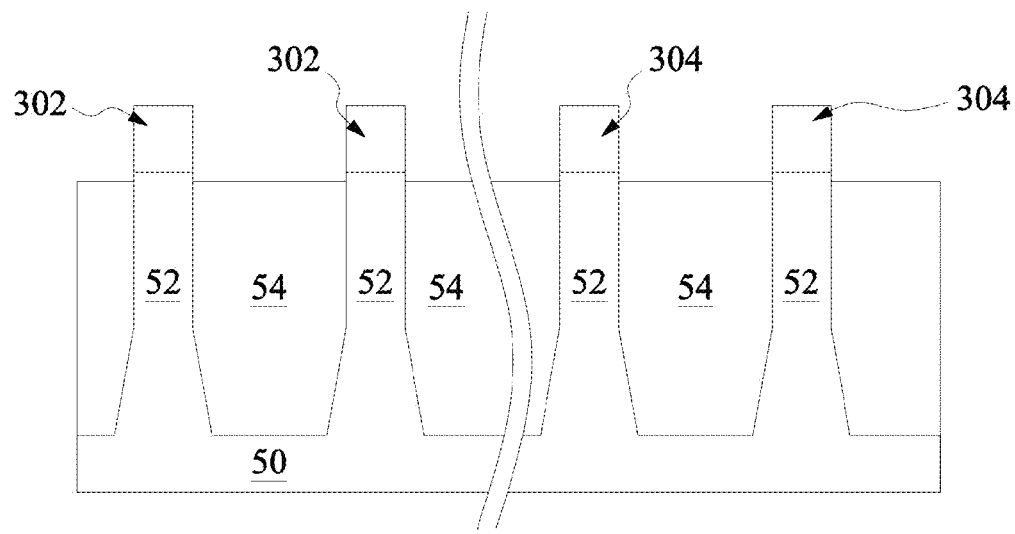

In FIG. 26, the isolation regions 54 are recessed, such as to form STI regions. The isolation regions 54 are recessed such that epitaxial portions in the first region 50B and in the second region 50C protrude from between neighboring insulating isolation regions 54. As illustrated, the top surfaces of the isolation regions 54 are below top surfaces of the fins 52 in the first region 50B and below the top surfaces of the fins 52 in the second region 50C. In other embodiments, the top surfaces of the isolation regions 54 may be above top surfaces of the fins 52 in one or more of the first and second regions 50B and 50C. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dHF acid may be used.

After the isolation regions 54 are recessed, appropriate wells may be formed in the epitaxial portions 302/304, fins 52, and/or substrate 50. For example, a P well may be formed in the first region 50B, and an N well may be formed in the second region 50C. The doping of the regions may be similar to the processes described above in FIGS. 10 and 11 and step 224 and the descriptions are not repeated herein.

Figure 27:
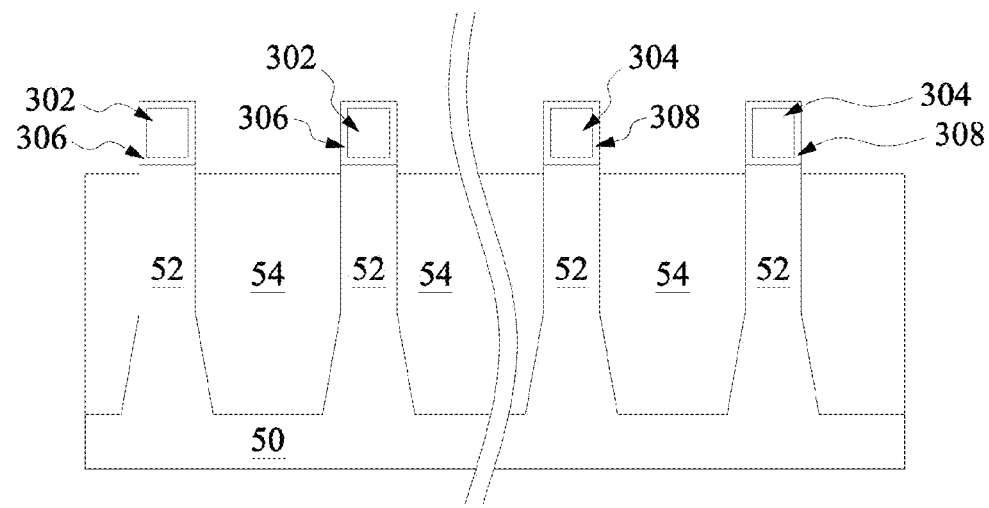

FIGS. 27 through 31 illustrate a process to remove a layer of damaged material from the outer surface of the epitaxial portions 302 and 304. As illustrated in FIG. 27, the epitaxial portions 302 and 304 may have damaged material layers 306 and 308, respectively on the sidewalls, top surfaces, and bottom surfaces of the epitaxial portions 302 and 304. In some embodiments, the damaged material layers 306 and 308 extend below the epitaxial portions 302 and 304 at the interface between the epitaxial portions 302 and 304 and the fins 52. These damaged material layers may be caused by thermal processes (e.g. anneal processes), oxidation of the epitaxial portions 302 and 304, and/or from plasma processes (e.g. dopant implants). As discussed above, the damaged material layers 306 and 308 can cause negatively affect device performance, especially when the devices are scaled down to the smaller technology nodes, such as 10 nm and less.

Figure 28:
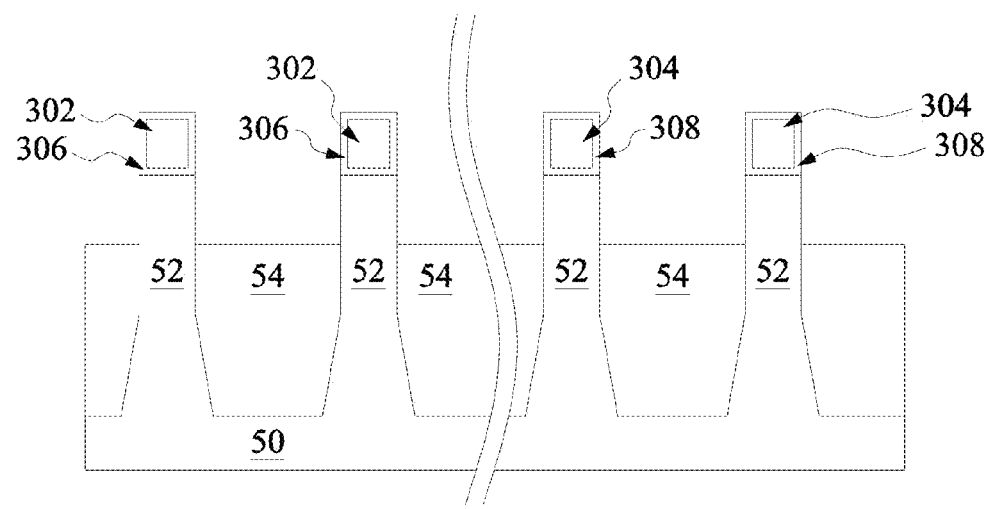

In FIG. 28, the isolation regions 54 are further recessed to expose portions of the fins 52 below the epitaxial portions 302 and 304. This recess step may be similar to the process described above in FIG. 26 and the description is not repeated herein.

Figure 29:
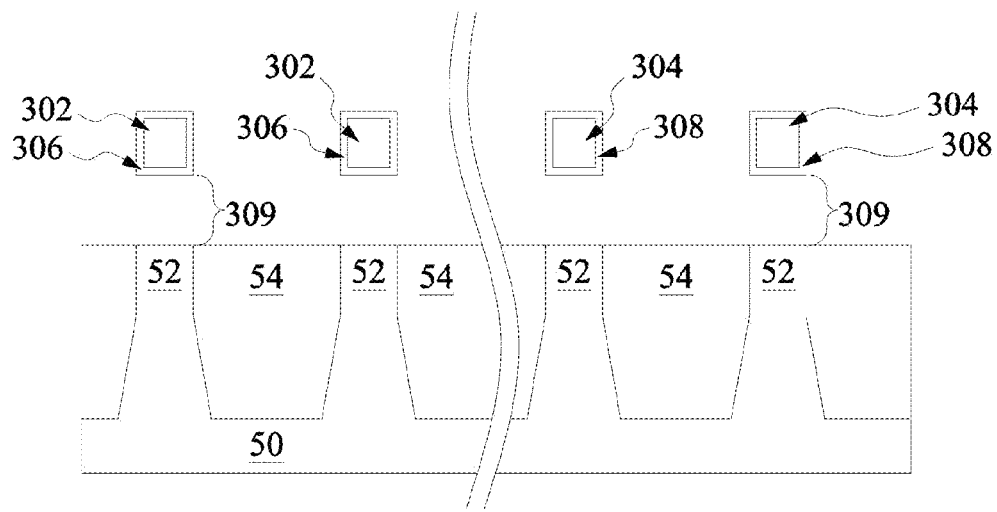

In FIG. 29, a selective etching step is performed to remove exposed portions of the fins 52 from below the epitaxial portions 302 and 304. Accordingly, the epitaxial portions 302 and 304 including the damaged material layers 306 and 308 are separated from the fins 52 by gaps 309. As a result, the epitaxial portions 302 and 304 are suspended. Opposite ends of the epitaxial portions 302 and 304 are connected to source/drain regions (see 102 and 104 in FIGS. 33B and 33C). The etching step is selective to the fins 52 and does not significantly attack the epitaxial portions 302 and 304 including the damaged material layers 306 and 308. The etching step can be a wet etch, a dry etch, or a combination thereof. For example, the etching can use a dry isotropic etch, such as using a mixture of HCl gas, $Cl_2$ gas, and/or $NF_3$ gas, or the like. As one of skill will readily understand, a selectivity of HCl gas and $Cl_2$ gas can be modified by controlling a temperature and pressure of the etching process. In another example, the etching can be a wet isotropic etch, such as APM, SPM, HPM, TMAH, $NH_4OH$, the like, or a combination thereof.

Figure 30:
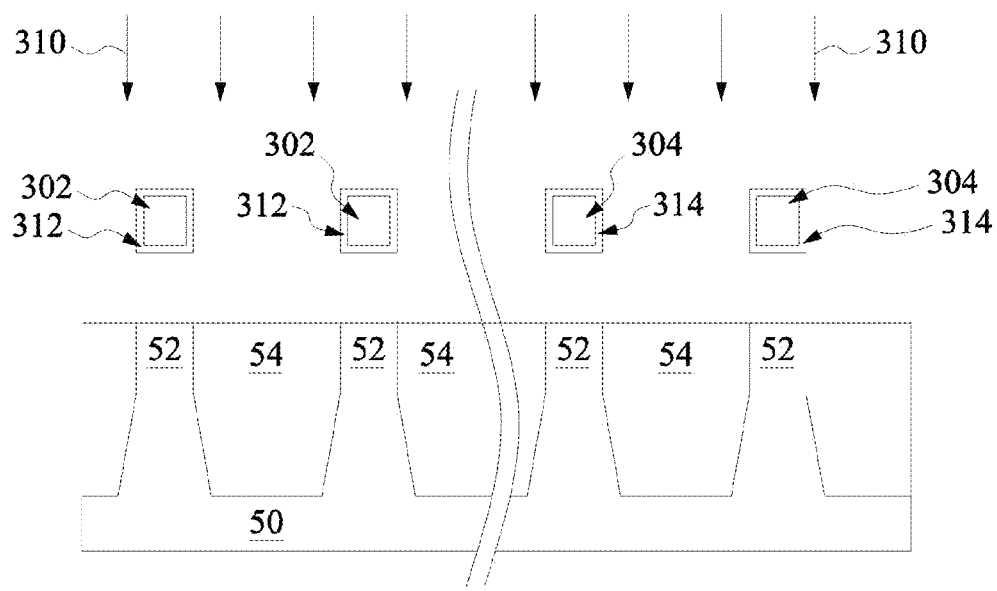

In FIG. 30, an oxidation process 310 is performed on the exposed portions of the epitaxial portions 302 and 304. The oxidation process forms oxide layers 312 and 314. In some embodiments, the formation of the oxide layers 312 and 314 consume at least a part of the damaged material layers 306 and 308. In some embodiments, the formation of the oxide layers 312 and 314 consume at all of the damaged material layers 306 and 308. The oxidation process 310 may be similar to the oxidation process 79 described above in FIG. 13 and step 226 and the description is not repeated herein.

Figure 31:
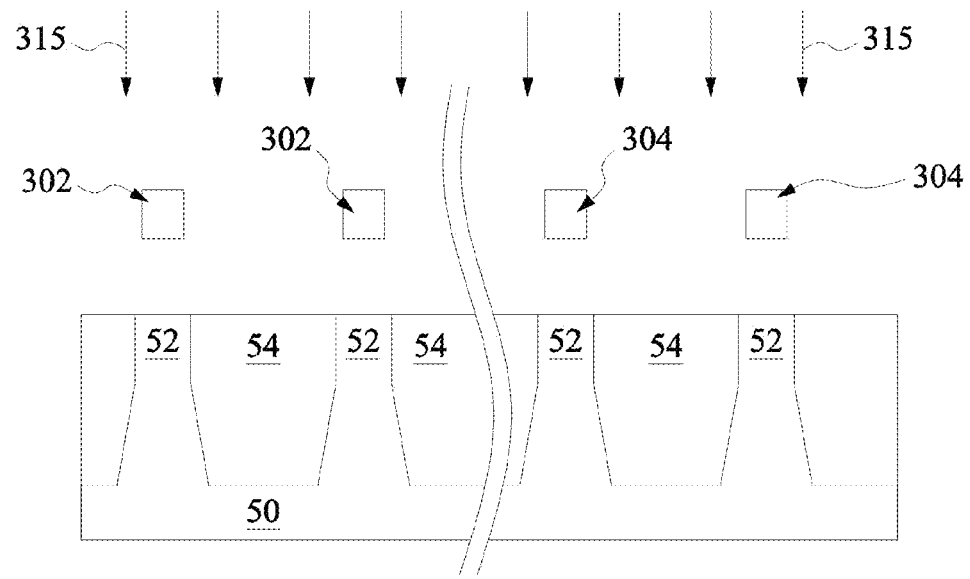
Figure 32:
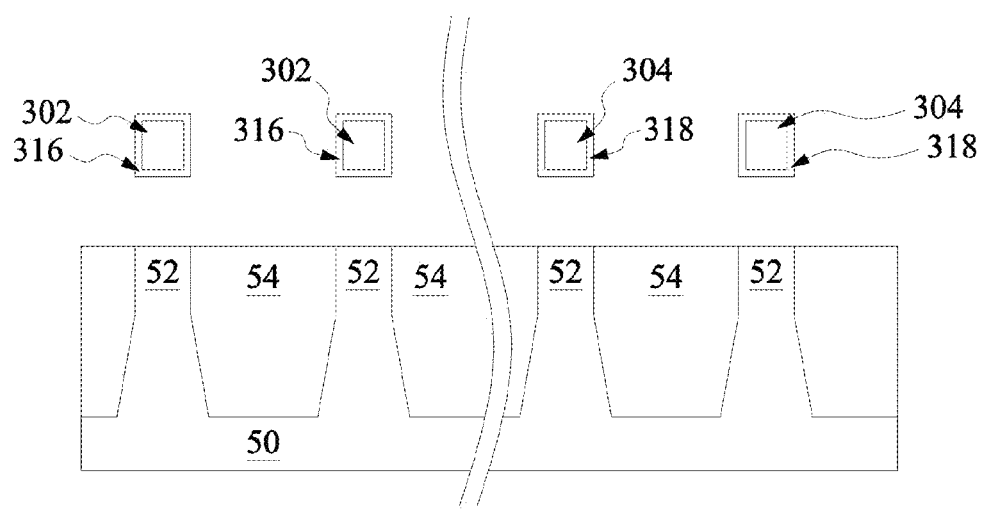

In FIG. 31, the oxide layers 312 and 314 are removed through a removal process 315. The removal process 315 may be similar to the removal process 80 described above and the description is not repeated herein. The oxidation and removal process may help to trim and/or round the epitaxial portions 302 and 304. In some embodiments, more than one cycle of oxidation and removal (i.e. one oxidation process 310 followed by one removal process 315) may be performed to remove all of the damaged material layers 312 and 314 and/or to trim/round the epitaxial portions 302 and 304. For example, the cycle of processes 310 and 315 may be repeated five times, ten times, fifteen times, or more time as necessary.

Although FIGS. 27 through 31 illustrate the oxidation and removal processes being performed on the first region 50B and the second region 50C simultaneously, the oxidation and removal processes may be performed separately on each of the regions by utilizing masking layers. In some embodiments, the oxidation and removal processes are not performed on one of the first region 50B and the second region 50C.

In FIGS. 32 and 33A-C, gate dielectric layers 316 and 318 and gate electrodes 320 and 322 are formed for replacement gates. The gate dielectric layers 316 and 318 may be formed on surfaces of the epitaxial portions 302 and 304 to completely surround the epitaxial portions 302 and 304. The gate dielectric layers 316 and 318 may be formed to surround the epitaxial portions 302 and 304 and may be similar to the gate dielectric layers 110 and 114 described above and the description is not repeated herein. The gate electrodes 320 and 322 may be formed to surround the gate dielectric layers 316 and 318 may be similar to the gate electrodes 112 and 116 described above and the description is not repeated herein.

As illustrated in FIGS. 33B and 33C, the GAA device illustrated may undergo further processing similar to that described above in the previous embodiments. For example, the GAA device may include source/drain regions 102 and 104, ILD 106, ILD 118, and contacts 120 and 122. The materials and formation of these structures were previously described and the descriptions are not repeated herein.

Although not explicitly shown, a person having ordinary skill in the art will readily understand that further processing steps may be performed on the structure in FIGS. 33A, 33B, and 33C. For example, various IMDs and their corresponding metallizations may be formed over ILD 118.

Figure 34:
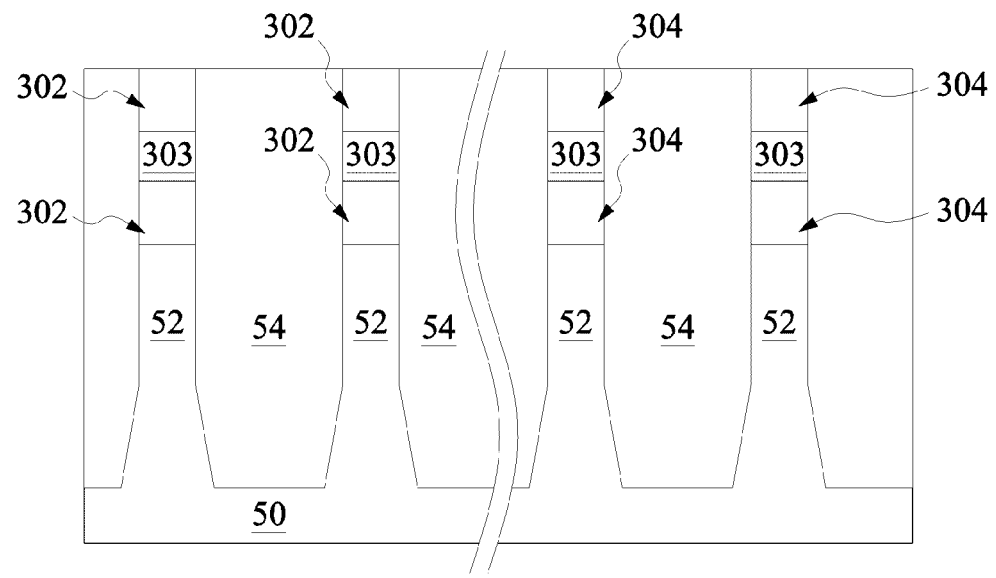
FIGS. 34 and 35 are cross-sectional views of intermediate stages comprising a modification in the manufacturing of a GAA device in accordance with some embodiments.
Figure 35:
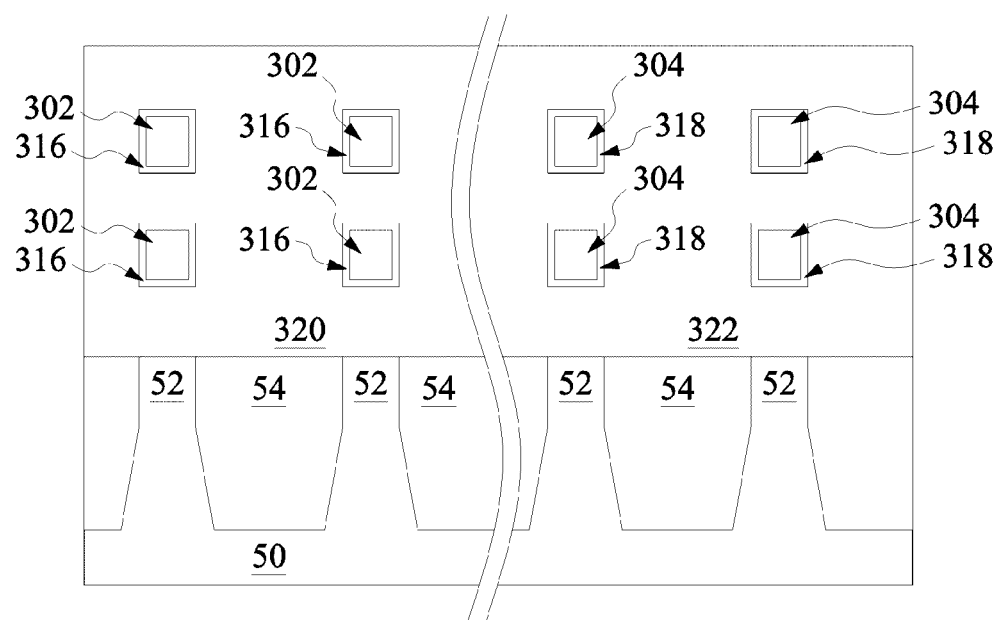

FIGS. 34 and 35 are cross-sectional views of intermediate stages comprising a modification in the manufacturing of a GAA device in accordance with some embodiments. This embodiment is similar to the embodiment illustrated in FIGS. 25-32 and 33A-C except that the GAA device includes stacked epitaxial portions 302 and 304 (sometimes referred to as stacked nanowires). In this embodiment, there are two layers of epitaxial portions 302 and 304 over each of the fins 52 with an epitaxial layer 303 separating the epitaxial portions 302 and 304 from each other. The epitaxial portions 303 may be similar material to the fins 52 or may be other materials that enable the epitaxial layers 303 to be selectively etched from between the epitaxial portions 302 and 304. For example, the epitaxial layers 303 may be Si, SiGe, Ge, the like, or a combination thereof. In FIG. 35 the gate dielectric layers 316 and 318 and gate electrodes 320 and 322 are illustrated. In this embodiment, the stacked epitaxial portions 302 and 304 over each fin 52 may be so close to each other that the gate dielectric layers 316 and 318 may coalesce (not shown) between the respective epitaxial portions 302 and 304.

Although FIGS. 34 and 35 illustrate two stacked layers of epitaxial portions 302 and 304 (two stacked nanowires), there may be more stacked epitaxial portions over each of the fins 52. For example, there may be three, four, five, or more of the stacked epitaxial portions over each of the fins 52.

Although not explicitly shown, a person having ordinary skill in the art will readily understand that further processing steps may be performed on the structure in FIGS. 34 and 35. For example, the GAA device may include source/drain regions 102 and 104, ILD 106, ILD 118, and contacts 120 and 122 (see FIGS. 33A-C). In addition, various IMDs and their corresponding metallizations may be formed over ILD 118.

Figure 37:
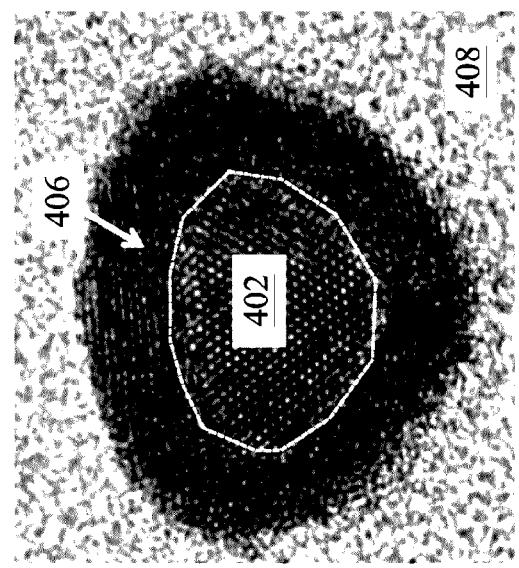
FIGS. 36 and 37 are transmission electron microscopy (TEM) images of samples in accordance with embodiments.
Figure 36:
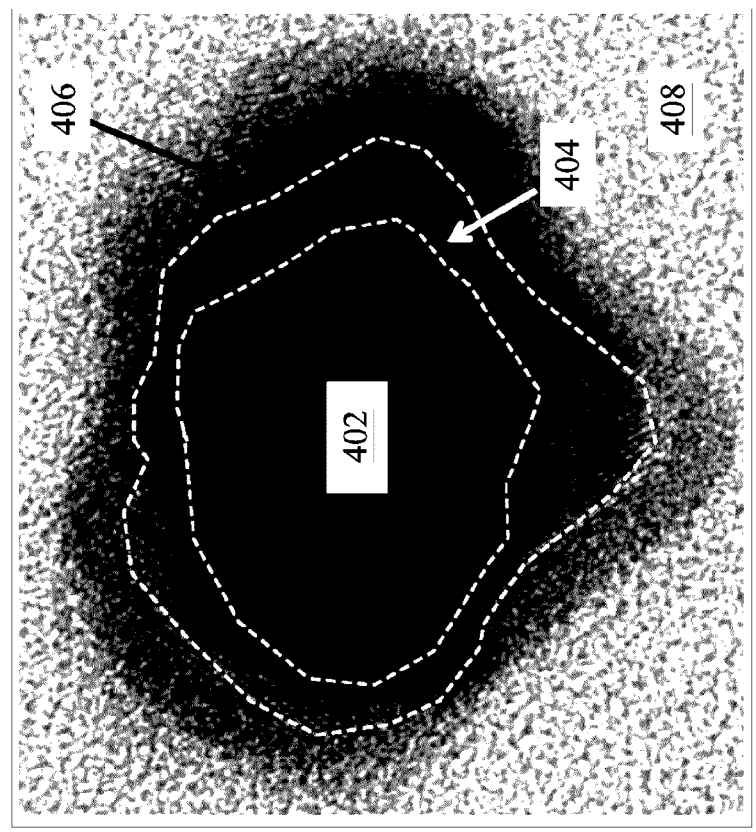

FIGS. 36 and 37 are transmission electron microscopy (TEM) images of samples in accordance with embodiments. FIG. 36 illustrates a GAA device including an epitaxial portion 402 (sometimes referred to as a nanowire 402) with a damaged material layer 404 on outer surfaces of the epitaxial portion 402. In addition, a gate dielectric layer 406 surrounds the damaged material layer 404 with a gate electrode 408 surrounding the gate dielectric layer 406.

FIG. 37 illustrates a GAA device utilizing the disclosed oxidation and removal process to remove the damaged material layer (see 404 in FIG. 36). In this embodiment, the gate dielectric layer 406 is directly on outer surfaces of the epitaxial portion 402 rather than having the damaged material layer 404 interposed between the gate dielectric layer 406 and the epitaxial portion 402 (see FIG. 36). In addition, the gate electrode 408 surrounds the gate dielectric layer 406. In this embodiment, a diameter of the epitaxial portion 402 may be in a range from about 5 nm to about 15 nm, such as about 10 nm.

Embodiments may achieve advantages. By having a process to remove a layer of damaged material from the outer surface of epitaxial portions of fins, source/drains, and nanowires, the performance of these devices can be improved. For example, these structures may have damaged material layers on their surfaces that are caused by thermal processes (e.g. anneal processes), oxidation, and/or from plasma processes (e.g. dopant implants). It has been found that the damaged material layers can cause negatively affect device performance, especially when the devices are scaled down to the smaller technology nodes, such as 10 nm and less. Further, the oxidation processes employed may be self-limiting to form oxide layers that specific and determinable thicknesses. The removal of these oxides is selective to the oxide layers such that it will remove the oxide layers without removing the epitaxial portions beneath them. As discussed above, the thickness of the oxide layers can be formed to have specific thicknesses (e.g. 1.1 nm, 5 nm, >5 nm), and hence, the removal process can be repeated to remove specific thicknesses of the damaged material layers until all of the damaged material layers are removed.

An embodiment is a method including forming an epitaxial portion over a substrate, the epitaxial portion including a III-V material. A damaged material layer being on at least one surface of the epitaxial portion. The method further including oxidizing at least outer surfaces of the damaged material layer to form an oxide layer, selectively removing the oxide layer, and repeating the oxidizing and the selectively removing steps while at least a portion of the damaged material layer remains on the epitaxial portion.

Another embodiment is a method including epitaxially growing a first crystalline semiconductor material on a substrate, the first crystalline semiconductor material and a portion of the substrate forming a fin on the substrate, where after the epitaxially growing the first crystalline semiconductor material, a damaged material layer is on at least a top surface and sidewalls of the first crystalline semiconductor material. The method further includes oxidizing at least outer surfaces of the damaged material layer to form an oxide layer, selectively removing the oxide layer, repeating the oxidizing and the selectively removing steps while at least a portion of the damaged material layer remains on the first crystalline semiconductor material, forming a gate dielectric on at least a top surface and sidewalls of the first crystalline semiconductor material, forming a gate electrode on the gate dielectric, and forming source/drain regions on the fin on opposite sides of the gate electrode.

A further embodiment is a method including forming a fin extending from a substrate, the fin comprising a first epitaxial portion, the first epitaxial portion including a III-V material, a damaged material layer surrounding the first epitaxial portion, forming an isolation region over the substrate and surrounding the fin, selectively etching a portion of the fin to suspend the first epitaxial portion over the substrate and at a level over a top surface of the isolation region, oxidizing the damaged material layer to form an oxide layer, selectively removing the oxide layer, repeating the oxidizing and the selectively removing steps while at least a portion of the damaged material layer remains on the first epitaxial portion, forming a gate dielectric surrounding the first epitaxial portion, forming a gate electrode on the gate dielectric, and forming source/drain regions on opposite ends of the first epitaxial portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an epitaxial portion over a substrate, the epitaxial portion comprising a III-V material, a damaged material layer being on at least one surface of the epitaxial portion;
   oxidizing at least outer surfaces of the damaged material layer to form an oxide layer;
   selectively removing the oxide layer; and
   repeating the oxidizing and the selectively removing steps while at least a portion of the damaged material layer remains on the epitaxial portion.

2. The method of claim 1, wherein the epitaxial portion is a source/drain region of a field-effect transistor.

3. The method of claim 1, wherein the epitaxial portion is an upper portion of a fin extending from the substrate.

4. The method of claim 3 further comprising:
   forming a gate dielectric on a top surface and sidewalls of the epitaxial portion;
   forming a gate electrode on the gate dielectric; and
   forming source/drain regions on the fin on opposite sides of the gate electrode, the fin, the epitaxial portion, the gate dielectric, the gate electrode, and the source/drain regions forming a fin field-effect transistor (FinFET).

5. The method of claim 1, wherein the epitaxial portion is a nanowire suspended over the substrate.

6. The method of claim 5 further comprising:
   forming a gate dielectric on and surrounding the epitaxial portion;
   forming a gate electrode on the gate dielectric, the gate electrode surrounding the epitaxial portion; and
   forming source/drain regions on opposite ends of the epitaxial portion, the epitaxial portion, the gate dielectric, the gate electrode, and the source/drain regions forming a gate all-around (GAA) fin field-effect transistor.

7. The method of claim 1, wherein the III-V material of the epitaxial portion comprises InAs, AlAs, GaAs, GaAsP, InP, GaInP, AlInP, GaN, InGaAs, InAlAs, InGaAlAs, GaSb, AlSb, AlP, GaP, or a combination thereof.

8. A method comprising:
epitaxially growing a first crystalline semiconductor material on a substrate, the first crystalline semiconductor material and a portion of the substrate forming a fin on the substrate, wherein after the epitaxially growing the first crystalline semiconductor material, a damaged material layer is on at least a top surface and sidewalls of the first crystalline semiconductor material;
oxidizing at least outer surfaces of the damaged material layer to form an oxide layer;
selectively removing the oxide layer;
repeating the oxidizing and the selectively removing steps while at least a portion of the damaged material layer remains on the first crystalline semiconductor material;
forming a gate dielectric on at least a top surface and sidewalls of the first crystalline semiconductor material;
forming a gate electrode on the gate dielectric; and
forming source/drain regions on the fin on opposite sides of the gate electrode.

9. The method of claim 8, wherein the first crystalline semiconductor material comprises InAs, AlAs, GaAs, GaAsP, InP, GaInP, AlInP, GaN, InGaAs, InAlAs, InGaAlAs, GaSb, AlSb, AlP, GaP, or a combination thereof.

10. The method of claim 8 wherein the forming source/drain regions on the fin on opposite sides of the gate electrode further comprises:
removing opposite end portions of the fin to form source/drain recesses; and
epitaxially growing the source/drain regions in the source/drain recesses.

11. The method of claim 8 further comprising:
oxidizing at least outer surfaces of the epitaxial source/drain regions to form an oxide layer; and
selectively removing the oxide layer from the source/drain regions.

12. The method of claim 8 further comprising:
before the oxidizing at least outer surfaces of the damaged material layer, selectively etching the portion of the substrate under the first crystalline semiconductor material to suspend the first crystalline semiconductor material over the substrate, the damaged material layer surrounding the first crystalline semiconductor material.

13. The method of claim 12, wherein the gate dielectric is on the top surface, bottom surface, and sidewalls of the first crystalline semiconductor material, the gate electrode surrounding the gate dielectric.

14. The method of claim 12 further comprising:
epitaxially growing a second material on the first crystalline semiconductor material;
epitaxially growing a third crystalline semiconductor material on the second material, the first crystalline semiconductor material, the second material, the third crystalline semiconductor material, and the portion of the substrate forming the fin; and
before the oxidizing at least outer surfaces of the damaged material layer, selectively etching the second material to suspend the third crystalline semiconductor material over the first crystalline semiconductor material, a second damaged material layer surrounding the third crystalline semiconductor material.

15. The method of claim 14 further comprising:
oxidizing at least outer surfaces of the second damaged material layer to form a second oxide layer;
selectively removing the second oxide layer; and
repeating the oxidizing and the selectively removing steps while at least a portion of the second damaged material layer remains on the third crystalline semiconductor material, wherein the gate dielectric is on the top surface, bottom surface, and sidewalls of the first crystalline semiconductor material and the third crystalline semiconductor material, the gate electrode surrounding the gate dielectric.

16. A method comprising:
forming a fin extending from a substrate, the fin comprising a first epitaxial portion, the first epitaxial portion comprising a III-V material, a damaged material layer surrounding the first epitaxial portion;
forming an isolation region over the substrate and surrounding the fin;
selectively etching a portion of the fin to suspend the first epitaxial portion over the substrate and at a level over a top surface of the isolation region;
oxidizing the damaged material layer to form an oxide layer;
selectively removing the oxide layer;
repeating the oxidizing and the selectively removing steps while at least a portion of the damaged material layer remains on the first epitaxial portion;
forming a gate dielectric surrounding the first epitaxial portion;
forming a gate electrode on the gate dielectric; and
forming source/drain regions on opposite ends of the first epitaxial portion.

17. The method of claim 16, wherein the III-V material of the first epitaxial portion comprises InAs, AlAs, GaAs, GaAsP, InP, GaInP, AlInP, GaN, InGaAs, InAlAs, InGaAlAs, GaSb, AlSb, AlP, GaP, or a combination thereof.

18. The method of claim 16, wherein the forming the fin extending from the substrate further comprises:
epitaxially growing a second material on the first epitaxial portion; and
epitaxially growing a third epitaxial portion on the second material, the third epitaxial portion comprising a III-V material, a second damaged material layer surrounding the third epitaxial portion.

19. The method of claim 18 further comprising:
selectively etching the second material to suspend the third epitaxial portion over the first epitaxial portion;
oxidizing the second damaged material layer to form a second oxide layer;
selectively removing the second oxide layer; and
repeating the oxidizing and the selectively removing steps while at least a portion of the second damaged material layer remains on the third epitaxial portion, wherein the gate dielectric surrounds the first epitaxial portion and the third epitaxial portion, the gate electrode surrounding the gate dielectric.

20. The method of claim 16, wherein the forming the fin extending from the substrate, the fin comprising a first epitaxial portion further comprises:
patterning the substrate to form a semiconductor strip extending from the substrate;
forming the isolation region over the substrate and surrounding the semiconductor strip;
recessing the semiconductor strip between the isolation region;

epitaxially growing the first epitaxial portion on the recessed semiconductor strip; and recessing the isolation region to expose a sidewall of the recessed semiconductor strip below the first epitaxial portion, wherein the selectively etching the portion of the fin further comprises selectively etching an exposed portion of the recessed semiconductor strip.

* * * * *